(12) United States Patent
Kakamu

(10) Patent No.: US 9,054,732 B2
(45) Date of Patent: Jun. 9, 2015

(54) SAR ANALOG-TO-DIGITAL CONVERSION METHOD AND SAR ANALOG-TO-DIGITAL CONVERSION CIRCUIT

(71) Applicant: FUJITSU SEMICONDUCTOR LIMITED, Yokohama-shi, Kanagawa (JP)

(72) Inventor: Tomoya Kakamu, Gifu (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/249,973

(22) Filed: Apr. 10, 2014

(65) Prior Publication Data

US 2014/0354458 A1 Dec. 4, 2014

(30) Foreign Application Priority Data

May 29, 2013 (JP) .................. 2013-112715

(51) Int. Cl.
| | |
|---|---|
| *H03M 1/38* | (2006.01) |
| *H03M 1/12* | (2006.01) |
| *H03M 1/46* | (2006.01) |
| *H03M 1/44* | (2006.01) |

(52) U.S. Cl.
CPC ................ *H03M 1/38* (2013.01); *H03M 1/129* (2013.01); *H03M 1/468* (2013.01); *H03M 1/44* (2013.01)

(58) Field of Classification Search
CPC ............ H03M 1/38; H03M 1/44; H03M 1/46
USPC ........................... 341/144, 155, 163, 120, 161
See application file for complete search history.

(56) References Cited

U.S. PATENT DOCUMENTS

| | | | | |
|---|---|---|---|---|
| 5,057,841 | A * | 10/1991 | Veerhoek et al. | 341/156 |
| 6,731,232 | B1 * | 5/2004 | Kearney | 341/163 |
| 7,432,844 | B2 * | 10/2008 | Mueck et al. | 341/163 |
| 8,416,116 | B2 * | 4/2013 | Chang et al. | 341/172 |
| 8,593,314 | B2 * | 11/2013 | Haneda et al. | 341/118 |
| 2004/0246153 | A1 | 12/2004 | Leung et al. | |
| 2011/0304493 | A1 | 12/2011 | Mitikiri et al. | |

OTHER PUBLICATIONS

Cao, et al., A 32mW 1.25GS/s 6b 2b/Step SAR ADC in 0.13um CMOS, IEEE International Solid-State Circuits Conference, 2008, 25 pages.
Wei, et al., A 0.024mm2 8-bit 400 MS/s SAR ADC with 2-bit per Cycle and Resistive DAC in 65 nm CMOS, 2011, 34 pages.

* cited by examiner

*Primary Examiner* — Brian Young
(74) *Attorney, Agent, or Firm* — Arent Fox LLP

(57) ABSTRACT

An SAR analog-to-digital conversion circuit includes: first and second CDACs; first to third comparators respectively comparing outputs of the first and second CDACs, output levels of the first and third CDACs with a reference level; an arithmetic operation circuit; and an SAR control circuit, wherein the SAR control circuit: at each step, determines in which of four ranges output levels of the sampled and held signals of the first and second CDACs are included, the four ranges corresponding to the conversion range being quartered, determines two bits of the digital data and adjusts the output levels of the first and second CDACs so that a level at ¼ or ¾ of the voltage range agrees with the intermediate level, and controls first and second switches so that the voltage range is set to be a conversion range at a next step.

8 Claims, 18 Drawing Sheets

FIG. 4

| OPERATION AFTER FIRST TIME COMPARISON | OPERATION AFTER (2+n) TH TIME AND SUBSEQUENT COMPARISONS (n=0, 1, 2...) |
|---|---|
| WHEN $D_n$ IS 0, ON +SIDE, MSB ↑ AND ON −SIDE, MSB ↓ | WHEN $D_n$ IS 0, ON +SIDE (3+2n) SB ↑ AND ON −SIDE, (3+2n) SB ↓ |
| WHEN $D_n$ IS 1, ON +SIDE, MSB ↓ AND ON −SIDE, MSB ↑ | WHEN $D_n$ IS 1, ON +SIDE (3+2n) SB ↓ AND ON −SIDE (3+2n) SB ↑ |
| WHEN $D_{n-1}$ IS 0, ON +SIDE 2SB ↑ AND ON −SIDE, 2SB ↓ | WHEN $D_{n-1}$ IS 0, ON +SIDE (4+2n) SB ↑ AND ON −SIDE, (4+2n) SB ↓ |
| WHEN $D_{n-1}$ IS 1, ON +SIDE 2SB ↓ AND ON −SIDE, 2SB ↑ | WHEN $D_{n-1}$ IS 1, ON +SIDE (4+2n) SB ↓ AND ON −SIDE, (4+2n) SB ↑ |

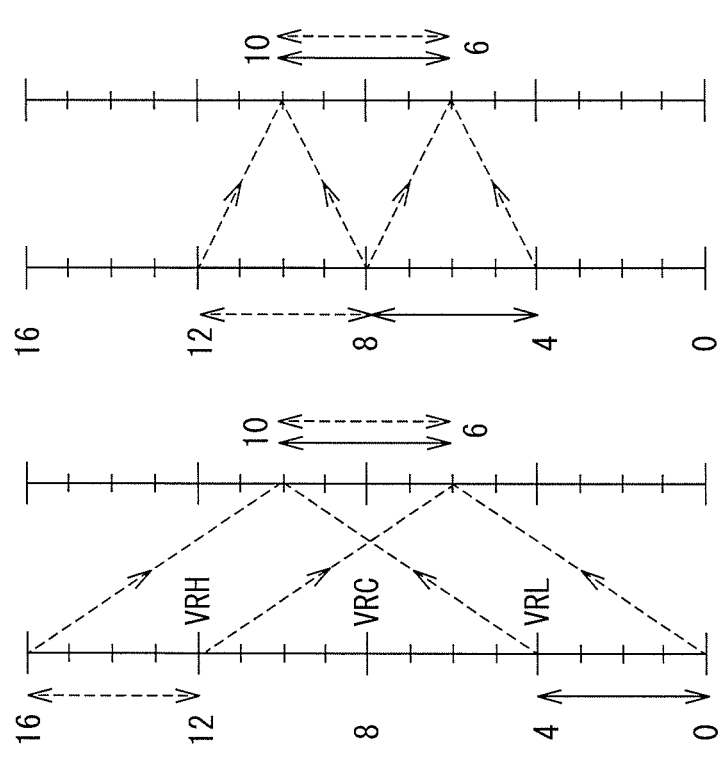

FIG. 11

| OPERATION AFTER FIRST TIME COMPARISON 1-bit COMPARISON | OPERATION AFTER SECOND TIME COMPARISON 1-bit COMPARISON | OPERATION AFTER (3+n)TH TIME AND SUBSEQUENT COMPARISONS (n=0, 1, 2...) 2-bit COMPARISON |
|---|---|---|
| WHEN Dn IS 0, ON +SIDE MSB ↑ AND ON −SIDE, MSB ↓ | WHEN Dn IS 0, ON +SIDE, 3SB ↑ AND ON −SIDE, (2SB+3SB) ↓ | WHEN Dn IS 0, ON +SIDE, (2+2n)SB ↑ AND ON −SIDE, NOTHING IS PERFORMED |
| WHEN Dn IS 1, ON +SIDE MSB ↓ AND ON −SIDE, MSB ↑ | WHEN Dn IS 1, ON +SIDE, (2SB+3SB) ↓ AND ON −SIDE, 3SB ↑ | WHEN Dn IS 1, ON +SIDE, NOTHING ISPERFORMED AND ON −SIDE, (2+2n)SB ↑ |
| | | WHEN Dn−1 IS 0, ON +SIDE, (5+2n)SB ↑ AND ON −SIDE, {(4+2n)+(5+2n)}SB ↓ |
| | | WHEN Dn−1 IS 1, ON +SIDE {(4+2n)+(5+2n)}SB ↓ AND ON −SIDE, (5+2n)SB ↑ |

FIG. 13A
FIG. 13B
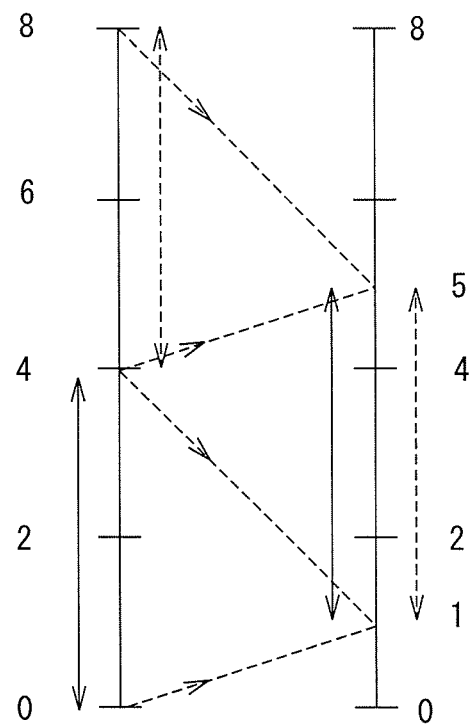
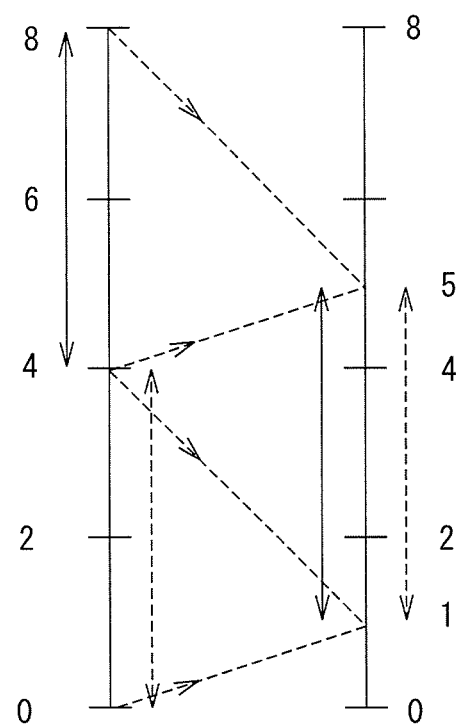

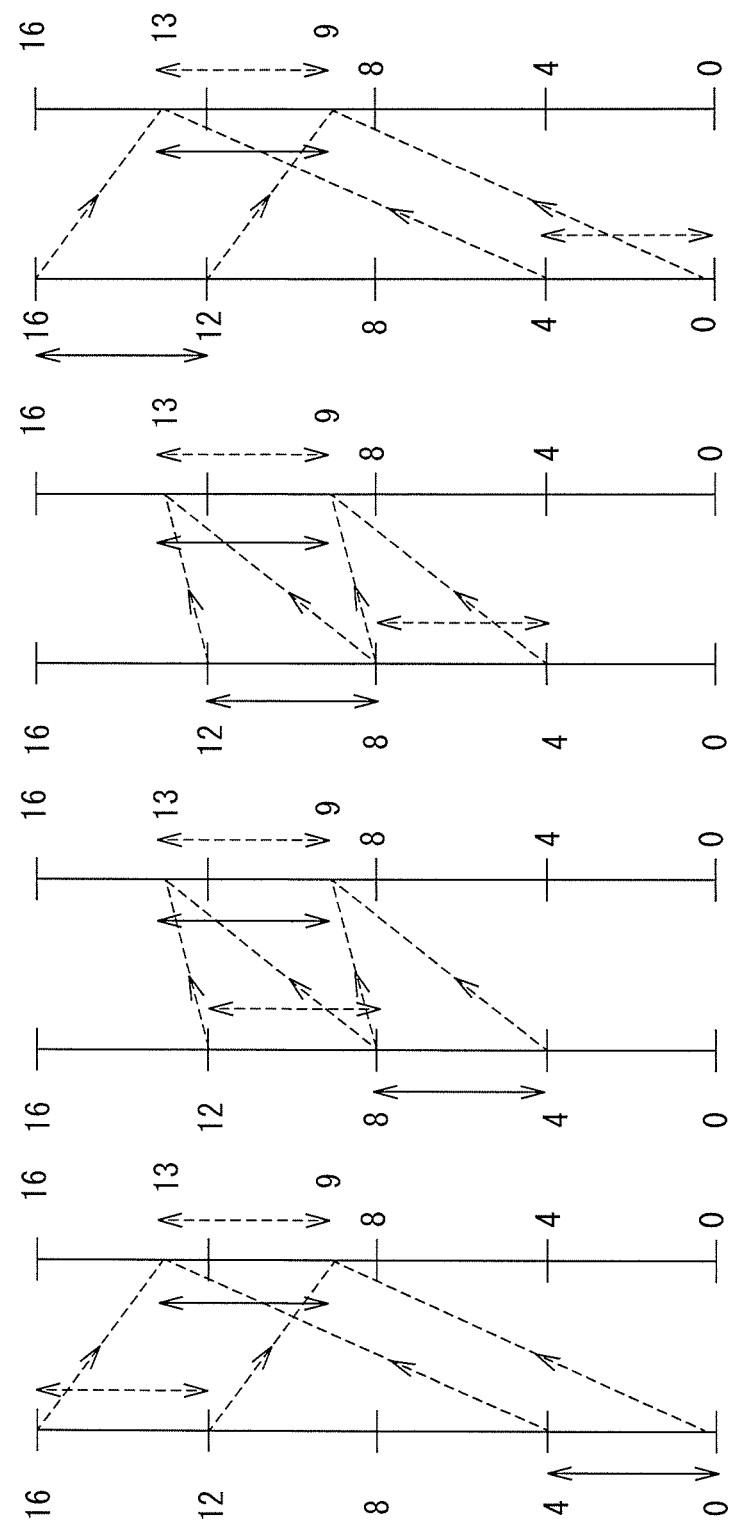

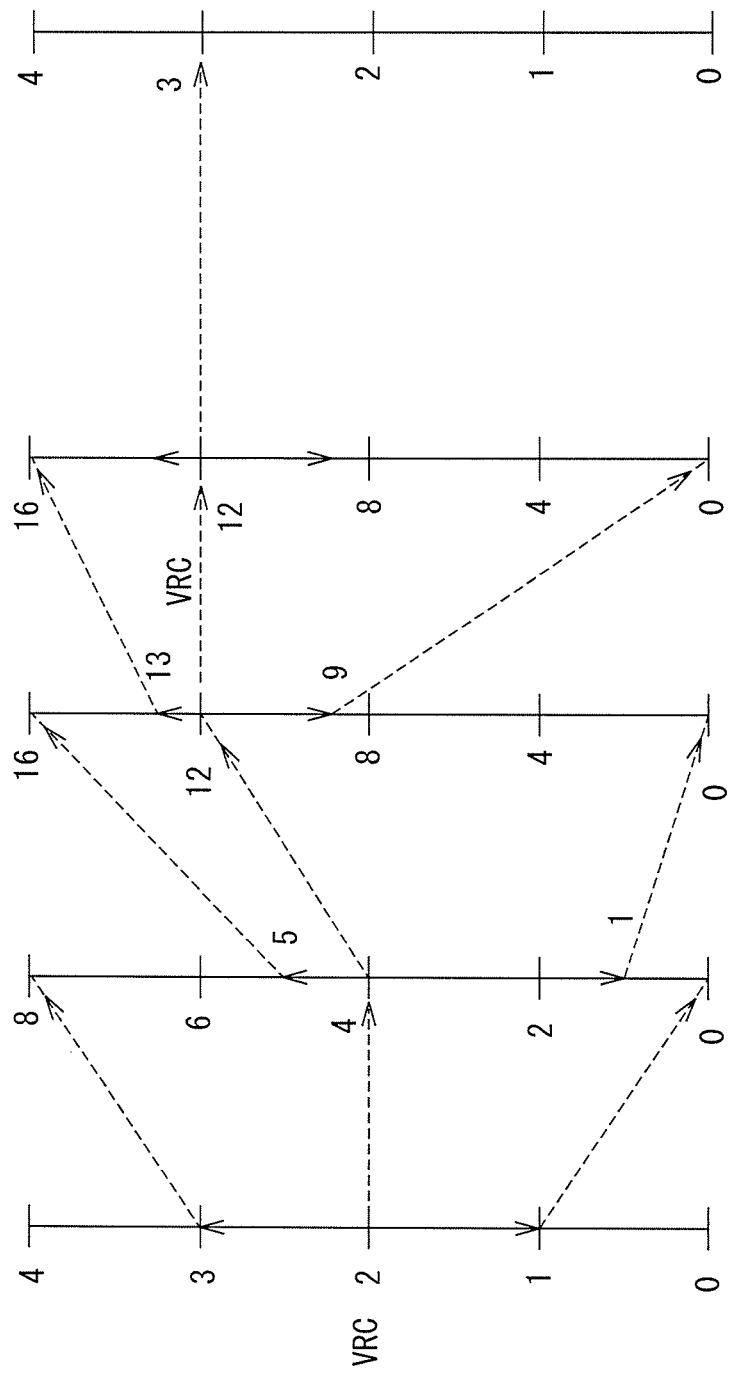

SAR ANALOG-TO-DIGITAL CONVERSION METHOD AND SAR ANALOG-TO-DIGITAL CONVERSION CIRCUIT

CROSS-REFERENCE TO RELATED APPLICATION

This application is based upon and claims the benefit of priority of the prior Japanese Patent Application No. 2013-112715, filed on May 29, 2013, the entire contents of which are incorporated herein by reference.

FIELD

The technique disclosed herein relates to an SAR analog-to-digital (AD) conversion method and an SAR analog-to-digital (AD) conversion circuit.

BACKGROUND

An analog-to-digital (AD) conversion circuit is widely used, and includes various kinds of conversion systems and for example, for high-speed use, a flash type AD conversion circuit is used and for the use in which the number of bits is large and latency may be slow, however, a speed to a certain level is desired, a pipeline type AD conversion circuit is used. However, in the case where the number of bits is large, the speed may be slow, a successive approximation routine (SAR) AD conversion circuit is used. The reference voltage used in AD conversion processing is generated in a digital-to-analog (DA) conversion circuit having a resistor string, a capacitive DA conversion circuit (CDAC) having a capacitor string and a switch string, or the like.

For the SAR type AD conversion circuit, an increase in speed is demanded and the AD conversion circuit the speed of which is increased by determining data corresponding to two bits at one step using three comparators has been proposed. However, at least three CDACs are used in order to generate the reference voltage to be supplied to the three comparators. In the case where a differential signal having a positive phase signal and a negative phase signal is AD-converted, six CDACs in total are provided.

It has also been proposed to generate the reference voltage described above to be supplied to the three comparators in a DA conversion circuit having a resistor string.

RELATED DOCUMENTS

[Patent Document 1] United States Laid Open Patent Publication No. 2011/0304493
[Patent Document 2] United States Laid Open Patent Publication No. 2004/0246153
[Non Patent Document 1] Z. Cao, et al. "A 32 mW 1.25 GS/s 6b 2b/Step SAR ADC in 0.13 um CMOS" ISSCC2008
[Non Patent Document 2] H. Wei, et al. "A 0.024 mm2 8-bit 400 MS/s SAR ADC with 2-bit per Cycle and Resistive DAC in 65 nm CMOS" ISSCC2011

SUMMARY

An SAR analog-to-digital conversion method according to a first aspect of the embodiments, includes: setting a level between a maximum level and a minimum level of a voltage value of a differential analog signal to be an intermediate level and setting a range between the maximum level and the minimum level to be a conversion range at a first step when sequentially converting the differential analog signal into digital data of two bits at each of steps; sampling and holding a positive phase signal of the differential analog signal in a first CDAC (capacitive DA converter) and a negative phase signal of the differential analog signal in a second CDAC; and at each step of sequentially converting the differential analog signal into digital data of two bits, determining in which of four ranges output levels of the sampled and held signals of the first and second CDACs are included, the four ranges corresponding to the conversion range being quartered, determining two bits of the digital data based on the determining result and at the same time, adjusting the output levels of the first and second CDACs so that a level at ¼ or ¾ of a voltage range, which is one of the four ranges in which the output levels of the first and second CDACs are determined to be included, agrees with the intermediate level, and performing an operation to set the voltage range as a conversion range at a next step.

An SAR analog-to-digital conversion circuit according to a second aspect of the embodiments, includes: a first CDAC (capacitive DA converter) that samples and holds a positive phase signal of a differential analog signal and which has a first switch for changing output levels; a second CDAC that samples and holds a negative phase signal of the differential analog signal and which has a second switch for changing output levels; a first comparator that determines which is larger of the output level of the first CDAC and the output level of the second CDAC; a second comparator that determines which is larger of the output level of the first CDAC and a reference level; a third comparator that determines which is larger of the output level of the second CDAC and the reference level; an arithmetic operation circuit that performs an arithmetic operation to find outputs of the first to third comparators; and an SAR control circuit that controls the first and second switches of the first and second CDACs based on the arithmetic operation results of the arithmetic operation circuit, wherein the SAR control circuit: sets a range between a maximum level and a minimum level of a voltage value of the differential analog signal to be a conversion range at a first step when sequentially converting the differential analog signal into digital data of two bits at each of steps; and at each step of sequentially converting the differential analog signal into digital data of two bits, determines in which of four ranges output levels of the sampled and held signals of the first and second CDACs are included, the four ranges corresponding to the conversion range being quartered, determines two bits of the digital data based on the determination result and at the same time, adjusts the output levels of the first and second CDACs so that a level at ¼ or ¾ of a voltage range, which is one of the four ranges in which the output levels of the first and second CDACs are determined to be included, agrees with the intermediate level, and controls the first and second switches so that the voltage range is set to be a conversion range at a next step.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF THE DRAWINGS

FIG. 4 is a diagram illustrating a sequence to switch the connection of the three-point switch of the CDAC;

FIG. 5A to FIG. 5D are diagrams each illustrating a shift sequence in which the first time comparing operation is performed with the sequence illustrated in FIG. 4 and then a shift is performed based on the result of the comparison;

FIG. 11 is a diagram illustrating a sequence to switch connections of the three-point switches of the CDAC and the CDAC;

FIG. 13A and FIG. 13B are diagrams each illustrating a shift sequence in which the second time comparing operation is performed with the sequence illustrated in FIG. 11 and then a shift is performed based on the result of the comparison;

FIG. 14A to FIG. 14D are diagrams each illustrating a shift sequence in which the third time and subsequent comparing operations at the second and subsequent steps are performed with the sequence illustrated in FIG. 11 and then a shift is performed based on the results of the comparisons;

FIG. 15 is a diagram putting together the shift result after the comparison and the transition of the range in the next comparison;

DESCRIPTION OF EMBODIMENTS

Before explaining the SAR analog-to-digital (SAR type AD) conversion circuit of an embodiment, a general example of the SAR type AD conversion circuit that determines two bits at one step is explained.

Figure 1:
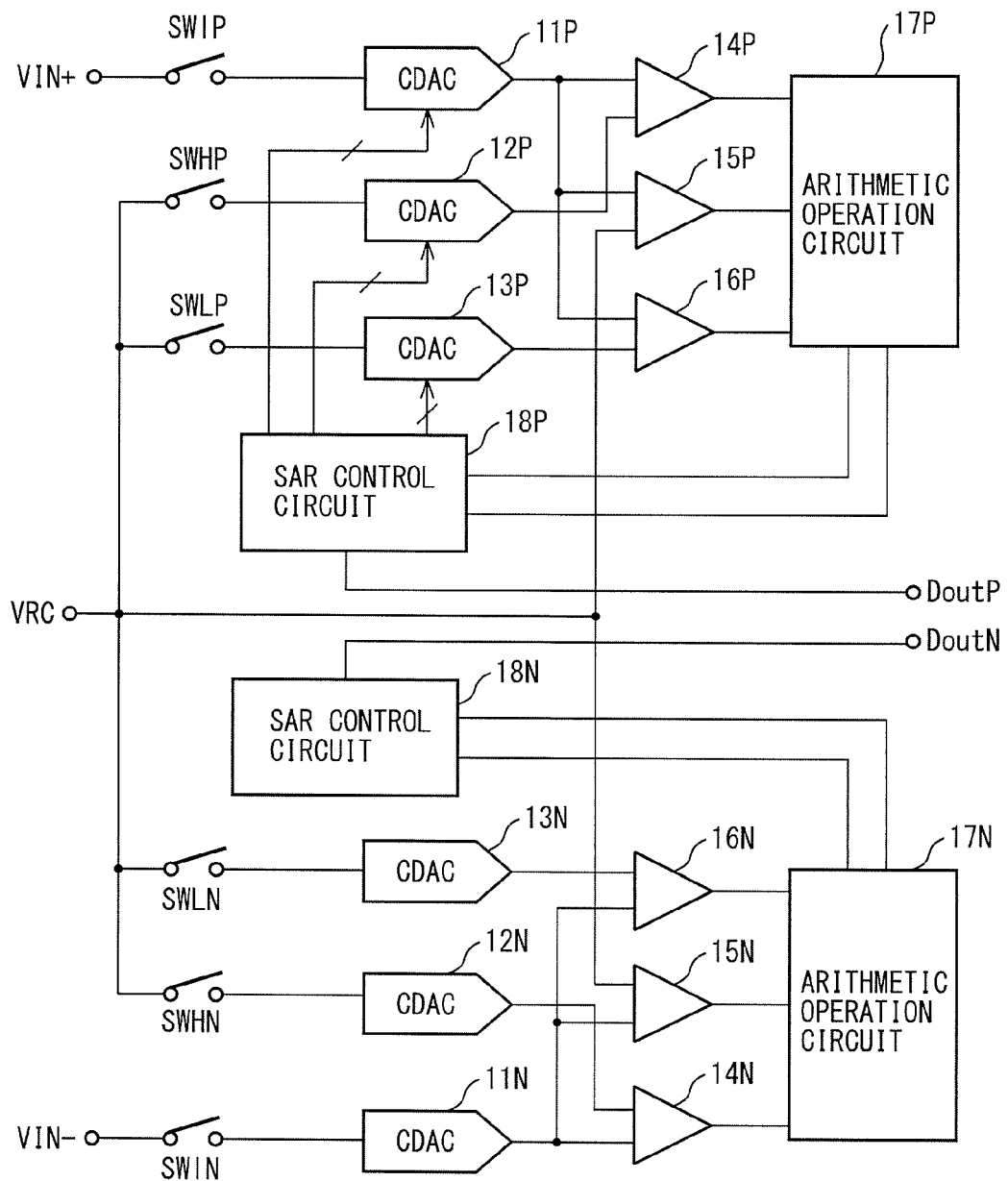
FIG. 1 is a diagram illustrating the entire configuration of an SAR type AD conversion circuit that converts differential analog signals VIN+ and VIN− into digital data.

FIG. 1 is a diagram illustrating the entire configuration of an SAR type AD conversion circuit that converts differential analog signals VIN+ and VIN− into digital data.

The SAR type AD conversion circuit has a positive phase conversion unit configured to convert the positive phase signal VIN+ of the differential analog signal into digital data and a negative phase conversion unit configured to convert the negative phase signal VIN− into digital data.

The positive phase conversion unit has three CDACs 11P to 13P, three comparators 14P to 16P, an arithmetic operation circuit 17P, an SAR control circuit 18P, and three switches SW1P, SWHP, and SWLP. The positive phase conversion unit samples the positive phase signal VIN+ of the differential analog signal and generates digital data DoutP.

The negative phase conversion unit has three CDACs 11N to 13N, three comparators 14N to 16N, an arithmetic operation circuit 17N, an SAR control circuit 18N, and three switches SW1N, SWHN, and SWLN. The negative phase conversion unit samples the negative phase signal VIN− of the differential analog signal and generates digital data DoutN.

As described above, the positive phase conversion unit and the negative phase conversion unit have configurations symmetrical to each other. Further, it is assumed that the positive phase signal VIN+ and the negative phase signal VIN− of the differential analog signal are signals symmetrical to each other with respect to a common voltage VRC, and therefore, the positive phase conversion unit and the negative phase conversion unit perform operations symmetrical to each other. Consequently, in the case where the positive phase signal VIN+ is converted into digital data with the common voltage VRC as a reference, it is possible to calculate digitally converted data of the negative phase signal VIN− by calculating data symmetrical with respect to the common voltage VRC. Hereinafter, the positive phase conversion unit is explained and explanation of the negative phase conversion unit is omitted, and explanation is given with P removed from the reference symbols.

Figure 2:
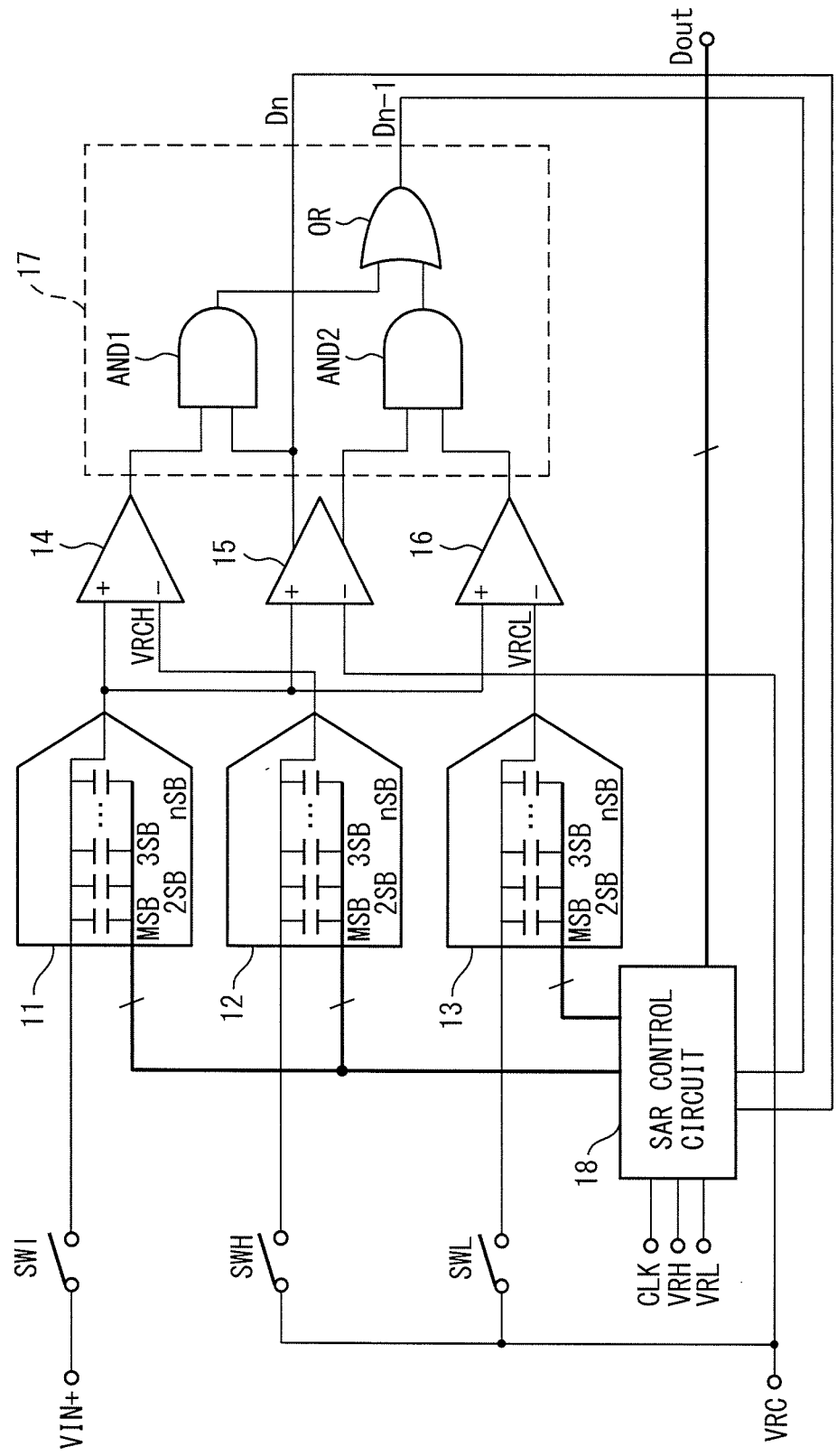
FIG. 2 is a diagram illustrating a configuration of a positive phase conversion unit of a general SAR type AD conversion circuit that determines two bits at one step.

FIG. 2 is a diagram illustrating a configuration of a positive phase conversion unit of a general SAR type AD conversion circuit that determines two bits at one step.

As illustrated in FIG. 2, the SAR type AD conversion circuit has three CDACs 11 to 13, three comparators 14 to 16, an arithmetic operation circuit 17, an SAR control circuit 18, and three switches SW1, SWH, and SWL. CLK denotes a clock based on which the SAR control circuit operates. VRH and VRL correspond to an upper limit and a lower limit of a voltage range of a signal on which the SAR type AD conversion circuit performs AD conversion processing, and the voltage range of the analog signal VIN+ is amplified so that the upper and lower limits thereof correspond to the VRH and the VRL. The common voltage VRC is at an intermediate voltage level between the VRH and the VRL and is supplied from outside, however, it may also be possible to generate the common voltage VRC by using a voltage divider circuit, etc., using a capacitor from the VRH and the VRL.

Figure 3:
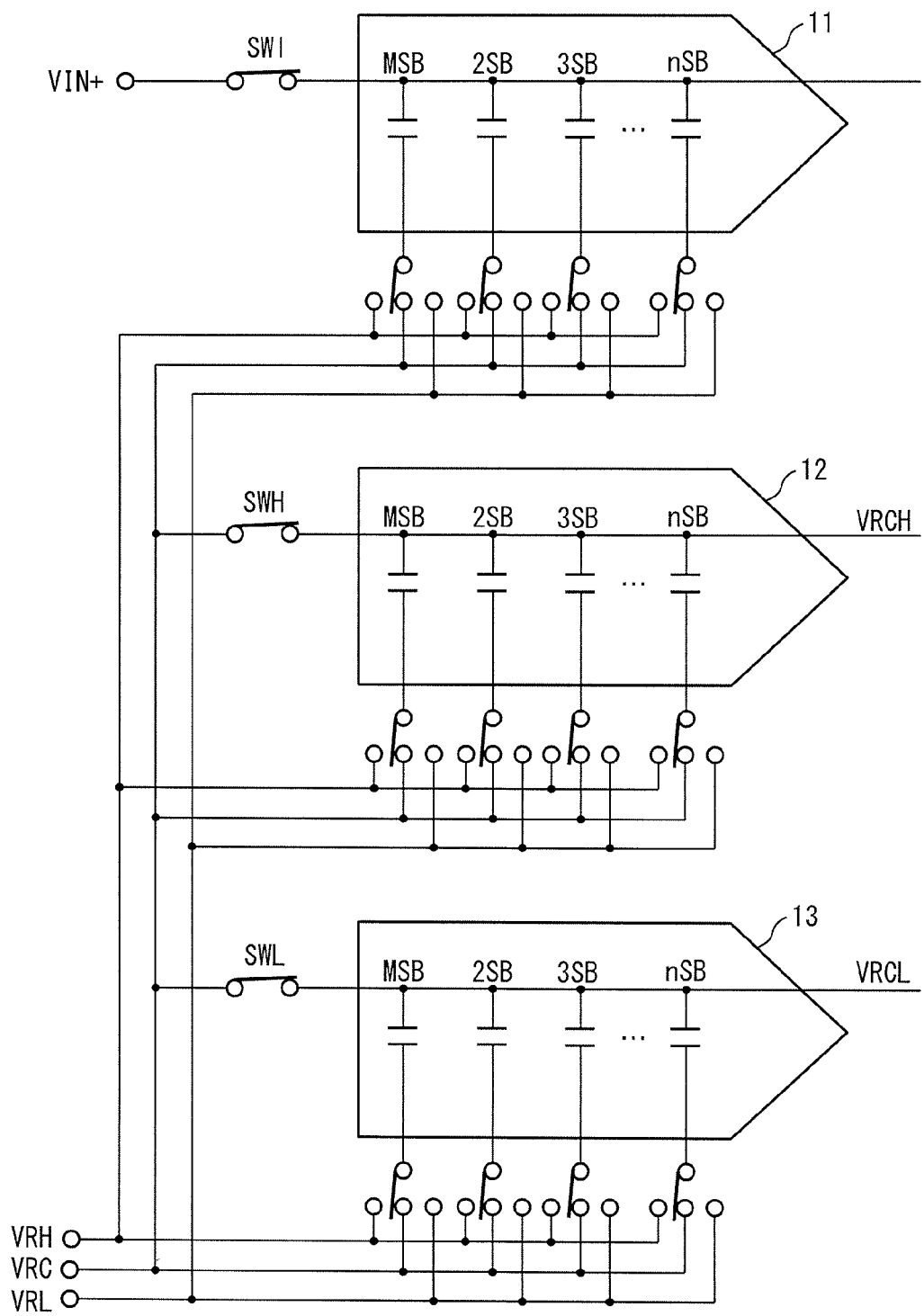
FIG. 3 is a diagram illustrating the portion of CDACs and switches in detail.

FIG. 3 is a diagram illustrating the portion of the CDACs 11 to 13 and the switches SW1, SWH, and SWL in detail.

The CDACs 11 to 13 have the same configuration. Each CDAC has n capacitors connected between n nodes MSB, 2SB, 3SB, ... nSB of a common signal line and n three-point switches. The n capacitors are weighted so that the capacitance value changes in powers of 2 (binary weight). For example, if the unit capacitance value is set to be C0, the capacitance values of the capacitors connected to the nodes MSB, 2SB, 3SB, ... nSB change in order of $C0 \times 2^n$, $C0 \times 2^{n-1}$, ..., $C0$. The three-point switch switches so that each terminal of the capacitors connects to one of the voltage sources VRH, VRC, and VRL. The connection of the three-point switch is controlled by the SAR control circuit 18.

The switch SW1 switches whether or not to connect the signal line of the CDAC 11 to the input terminal of the analog signal VIN+. The switch SWH switches whether or not to connect the signal line of the CDAC 12 to the common power source VRC. The switch SWL switches whether or not to connect the signal line of the CDAC 13 to the common power source VRC.

The CDAC 11 samples the analog signal VIN+ by shutting off the SW1 after connecting the SW1 in the state where all the three-point switches are connected to the VRC. In this state, the CDAC 11 outputs the VIN+. By connecting the three-point switch from the VRC to the VRH or to the VRL from this state, the output of the CDAC 11 increases or decreases in accordance with the weighting of the corresponding capacitor. For example, the output of the CDAC 11 increases by about (VRH−VRL)/2 if all the three-point switches are switched from the VRC to the VRH, and decreases by about (VRH−VRL)/2 if all of the three-point switches are switched from the VRC to the VRL.

An output VRCH of the CDAC 12 changes to the VRC by shutting off the SWH after connecting the SWH in the state where all the three-point switches are connected to the VRC. By connecting the three-point switch from the VRC to the VRH or to the VRL from this state, the output VRCH of the CDAC 12 increases or decreases in accordance with the weighting of the corresponding capacitor. For example, the output VRCH of the CDAC 12 increases by about (VRH−VRL)/2 if all of the three-point switches are switched from the VRC to the VRH, and decreases by about (VRH−VRL)/2 if all of the three-point switches are switched from the VRC to the VRL. Consequently, it is possible to change the output VRCH of the CDAC 12 substantially from the VRH to the VRL. This is also true with the CDAC 13 and it is possible to change an output VRCL of the CDAC 13 substantially from the VRH to the VRL.

For the CDAC, various kinds of configuration examples have been proposed and the operation thereof is widely known, and therefore, a detailed explanation is omitted.

Returning to FIG. 2, the comparator 14 compares the output of the CDAC 11 and the VRCH. The comparator 15 compares the output of the CDAC 11 and the VRC. The comparator 16 compares the output of the CDAC 11 and the VRCL.

The arithmetic operation circuit 17 has two NAND gates AND1 and AND2 and an OR gate OR. The arithmetic operation circuit 17 outputs the positive phase output of the comparator 15 as data Dn as it is. The AND1 performs an arithmetic operation to find a logical AND of the output of the comparator 14 and the positive phase output of the comparator 15. The AND2 performs an arithmetic operation to find a logical AND of the negative phase output of the comparator 15 and the output of the comparator 16. The OR performs an arithmetic operation to find a logical OR of the output of the AND1 and the output of the AND2. The output of the OR is output as data Dn−1.

The SAR control circuit 18 controls the switches SW1, SWH, and SWL of the CDACs 11 to 13 in accordance with data Dn and Dn−1 output from the arithmetic operation circuit 17.

Next, the operation of the SAR type AD conversion circuit in FIG. 2 is explained.

In order to carry out one-time AD conversion, steps of performing sampling and of performing 2-bit comparison and shift in the order of 2-bit comparison, shift, 2-bit comparison, shift, . . . , 2-bit comparison are performed repeatedly, and the number of times of repetition is determined based on the number of bits.

Sampling is performed by temporarily connecting the SW1, the SWH, and the SWL and then shutting off them again in a state where all the three-point switches of the CDACs 11 to 13 are connected to the VRC. Due to this, the VIN+ is sampled and held in the CDAC 11. The output VRCH of the CDAC 12 becomes the VRC, however, the three-point switches of the CDAC 12 are switched so that the output VRCH of the CDAC 12 becomes (3VRH+VRL)/4=(VRH+VRC)/2. Further, the output VRCL of the CDAC 13 becomes the VRC, however, the three-point switches of the CDAC 13 are switched so that the output VRCL of the CDAC 13 becomes (VRH+3VRL)/4=(VRC+VRL)/2. After the sampling, the step of performing 2-bit comparison and shift is repeated.

FIG. 4 is a diagram illustrating a sequence to switch the connection of the three-point switch of the CDAC 11. As described previously, the target is a differential analog signal, and therefore, in FIG. 4, the sequence described by the + side is the sequence for the CDAC that samples the VIN+ and the sequence described by the − side is the sequence for the CDAC that samples the VIN−. In FIG. 4, the upward arrow indicates switching from the VRC to the VRH of the corresponding three-point switch of the capacitor array and the downward arrow indicates switching from the VRC to the VRL.

FIG. 5A to FIG. 5D are diagrams each illustrating a shift sequence in which the first time comparing operation is performed with the sequence illustrated in FIG. 4 and then a shift is performed based on the result of the comparison. FIG. 5A to FIG. 5B each illustrate a case where the range of existence of the VIN+ and the VIN− is included in any of four ranges into which the input voltage range is quartered. In FIG. 5A to FIG. 5D, the solid-line arrow along the scale on the left side indicates the range of existence of the voltage of the VIN+, the broken-line arrow indicates the range of existence of the voltage of the VIN−, and the portion at which the solid-line arrow and the broken-line arrow overlap along the scale on the right side indicates the shifted range. In FIG. 5A to 5D, the reason that the range is from 0 to 16 is that two bits are determined by the comparing operation, then a shift is performed based on the determination result, and two bits are determined in the next comparison, and therefore, the total is four bits, and if the LSB at the time of the next comparison is assumed to be 1, the maximum will be 16. The shift is performed by controlling the connection of the three-point switches of the CDAC 11 on the + side and the CDAC on the − side.

As illustrated in FIG. 5A, in the case where the comparison result of the Dn and the Dn−1 is 00, the voltage on the VIN+ side (hereinafter, + side) exists between 0 and 4 and the voltage on the VIN− side (hereinafter, − side) exists between 12 and 16. For this comparison result, a shift is performed so that the + side is increased by 6 and the − side is reduced by 6.

FIG. 5B illustrates the case where the comparison result of the Dn and the Dn−1 is 01, and in this case, the voltage of the CDAC 11 on the + side exists between 4 and 8 and the voltage on the − side exists between 8 and 12. For this comparison result, the + side is increased by 2 and the − side is reduced by 2.

FIG. 5C illustrates the case where the comparison result of the Dn and the Dn−1 is 10, and in this case, the voltage of the CDAC 11 on the + side exists between 8 and 12 and the voltage on the − side exists between 4 and 8. For this comparison result, the + side is reduced by 2 and the − side is increased by 2.

FIG. 5D illustrates the case where the comparison result of the Dn and the Dn−1 is 11, and in this case, the voltage of the CDAC 11 on the + side exists between 12 and 16 and the voltage on the − side exists between 0 and 4. For this comparison result, the + side is increased by 6 and the − side is reduced by 6.

As above, by changing the amount of shift in accordance with the comparison result, the range in which the voltage of the CDAC 11 on the + side and the voltage of the corresponding CDAC on the − side are included is caused to be the range between 6 and 10 without fail after the shift regardless of the comparison result.

Figure 6:
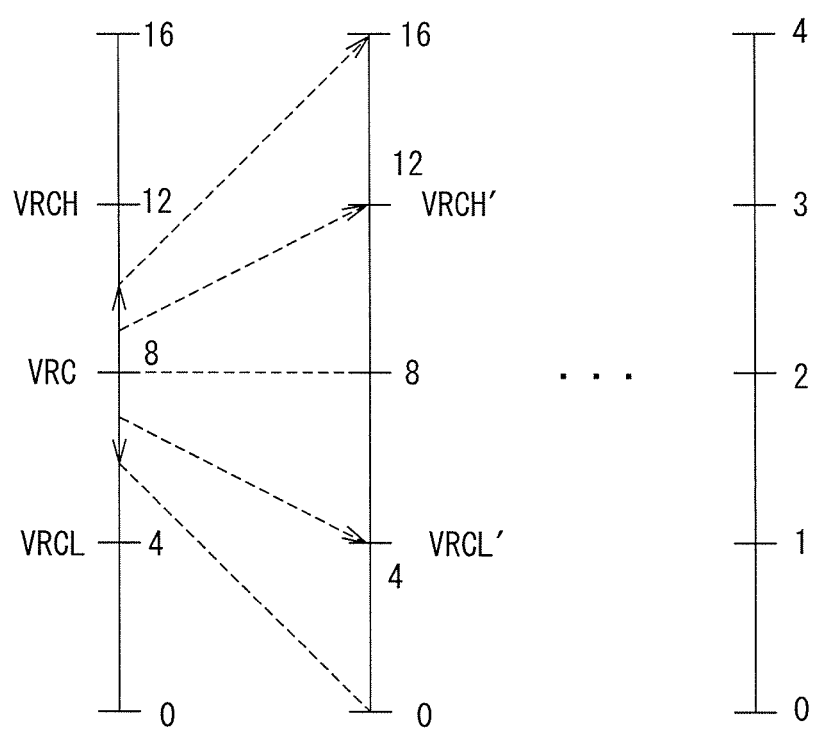
FIG. 6 is a diagram illustrating the shift result after comparison and the transition of the range in the next comparison together.

FIG. 6 is a diagram illustrating the shift result after comparison and the transition of the range in the next comparison together. As illustrated in FIG. 6, a comparison is made in the range of 0 to 16 and the range is shifted to 6 to 10 by the shift after the comparison. The shifted rage of 6 to 10 corresponds to 0 to 16 of the next comparison range. The final comparison is the 2-bit determination, and therefore, the comparison range is indicated by 0 to 4. The level of the VRC is at an intermediate level at all times also in the shifted range. However, if the voltage of the CDAC 11 on the + side and the voltage of the corresponding CDAC on the − side are shifted, the VRCH no longer agrees with the border between the first range and the second range into which the range after the shift is quartered and the VRCL no longer agrees with the border between the third range and the fourth range. Because of this, as indicated by VRCH' and VRCL' in FIG. 6, the VRCH and the VRCL are set again for each comparison. The change of the VRCH and the VRCL is made by switching the three-point switches of the CDACs 12 and 13 on the + side and the corresponding CDAC on the − side to shift the VRCH and the VRCL to the levels that agree with the above-described boarders of the shifted ranges. In order to perform these settings, at least two DACs are used, which result in an increase in the area because the number of DACs to be mounted increases.

The setting method is explained in accordance with the following specific example.

Figure 7:
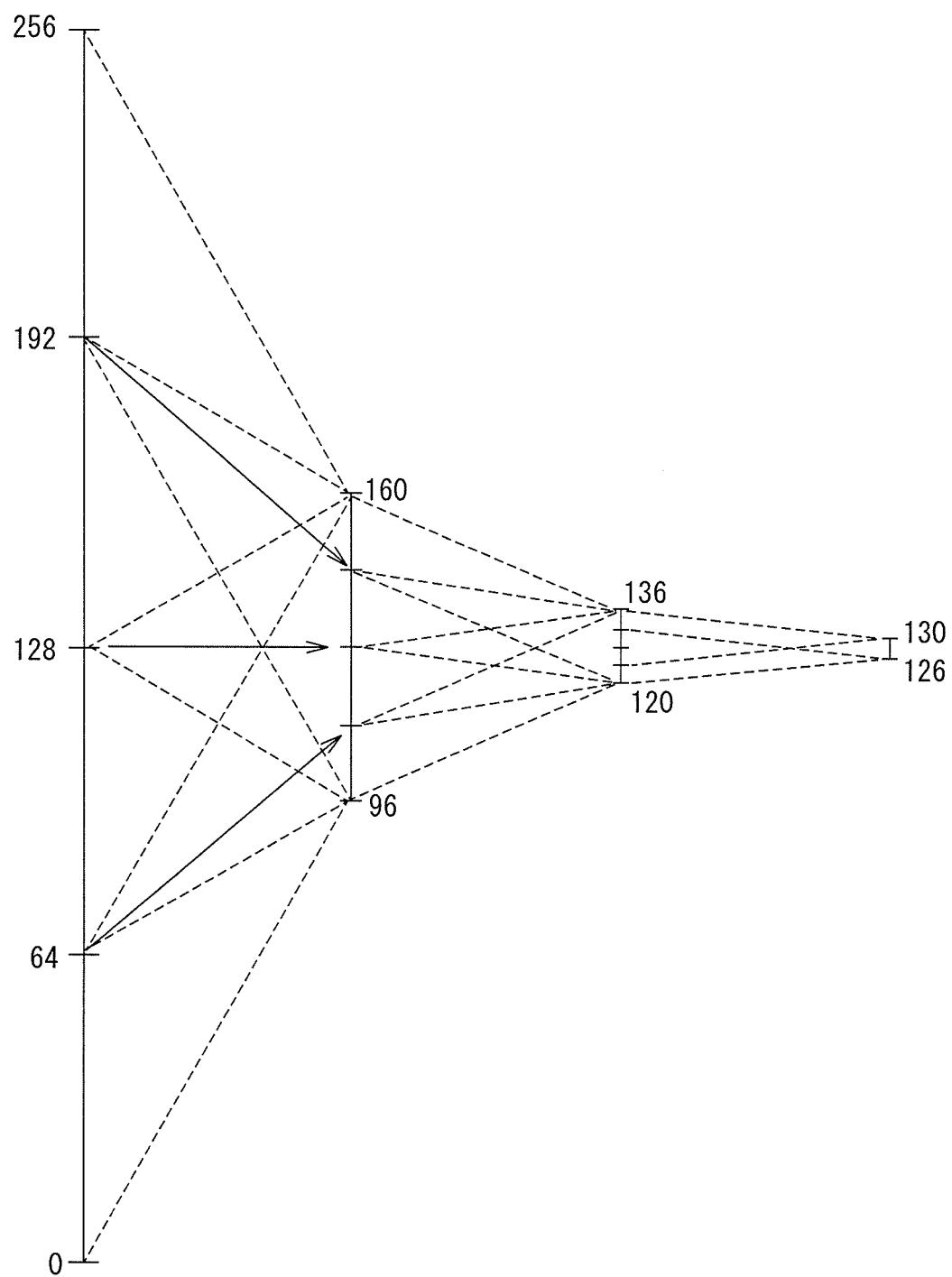
FIG. 7 is a diagram illustrating how the range is reduced by the shift of the range based on the comparison result explained in FIG. 5 and FIG. 6 by setting the case of 8-bit AD conversion processing as an example.

FIG. 7 is a diagram illustrating how the range is reduced by the shift of the range based on the comparison result explained in FIG. 5 and FIG. 6 by setting the case of 8-bit AD conversion processing as an example.

In FIG. 5A to FIG. 5D and in FIG. 6, the shifted range is illustrated as an enlarged range because of convenience of representation, however, the range is not enlarged actually and as illustrated in FIG. 7, the range is reduced sequentially. However, in the representation as in FIG. 7, the detailed part is not clear, and therefore, representation is given as in FIG. 5A to FIG. 5D and in FIG. 6.

Figure 8:
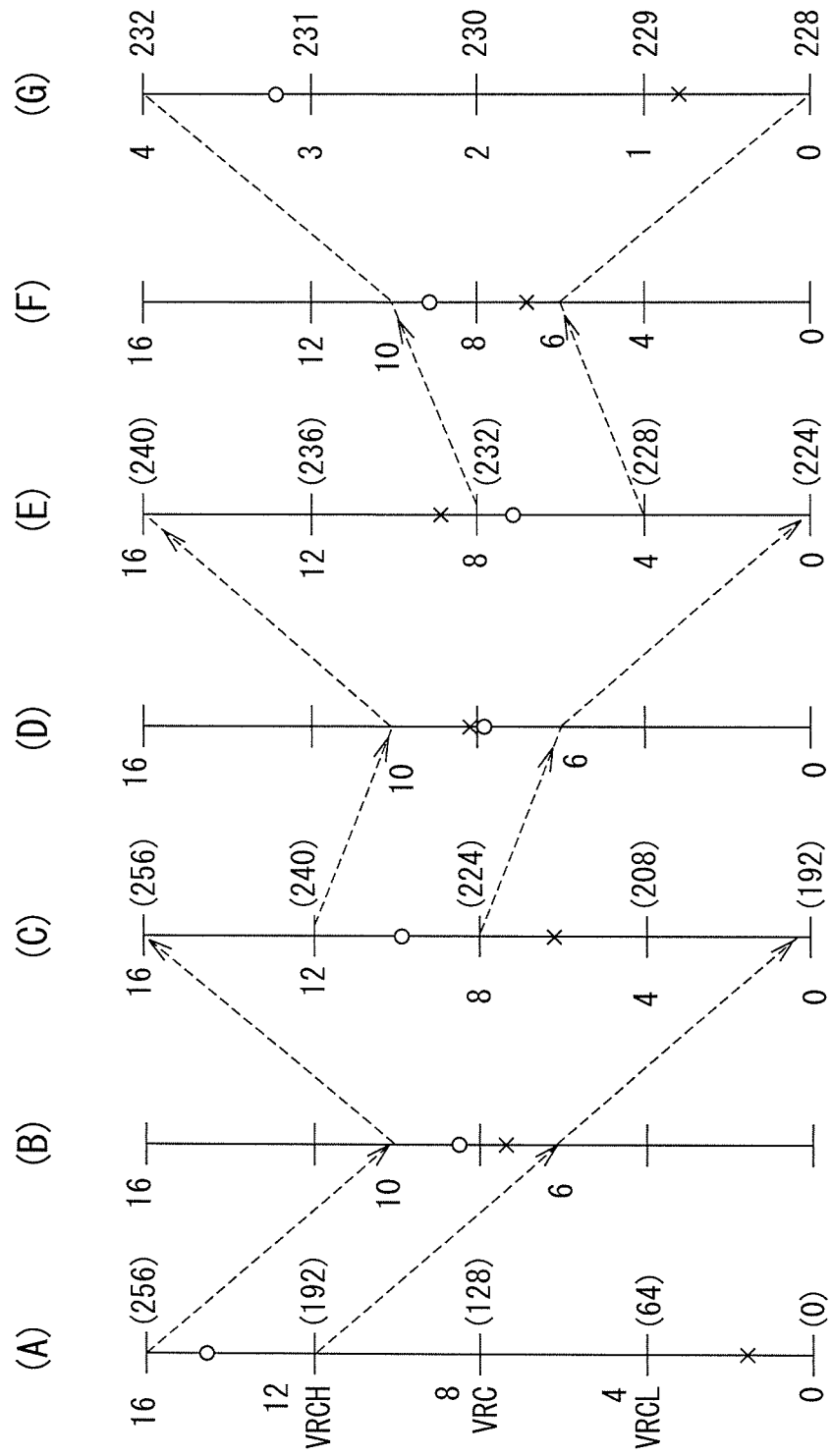
FIG. 8 is a diagram illustrating the transition of processing in the case where the voltage level of the sampled differential analog signal is 231 (equal to or more than 231 and less than 232) on the + side and 24 on the − side in the 8-bit AD conversion processing.

FIG. 8 is a diagram illustrating the transition of processing in the case where the voltage level of the sampled differential analog signal is 231 (equal to or more than 231 and less than 232) on the + side and 24 on the − side in the 8-bit AD conversion processing. In FIG. 8, the circle mark indicates the voltage level on the + side and the cross mark indicates the voltage level on the − side.

At the time of sampling, the SW1, the SWH, and the SWL turn on (are connected) and all the three-point switches of the CDACs 11 to 13 are connected to the VRC. Next, the sampling is ended, the SW1, the SWH, and the SWL are turned off (shut off), the switch at the MSB of the CDAC 12 is switched to the VRH, and the VRCH is set to 12 in the level indication in which 16 is the maximum (192 in the indication the maximum of which is 256) in FIG. 8. The switch at the MSB of the CDAC 13 is switched to the VRL and the VRCL is set to 4 (64 in the indication the maximum of which is 256) in FIG. 8. Hereinafter, the level indication in FIG. 8 is explained and explanation of the indication the maximum of which is 256 is omitted.

In FIG. 8, (A) indicates the state described above. In this state, if the comparators 14 to 16 perform a comparison, the comparison result of the Dn and the Dn−1 on the + side will be 11 because the voltage level exists between 12 and 16. The comparison result of the Dn and the Dn−1 on the − side will be 00 because the voltage level exists between 0 and 4.

In FIG. 8, as illustrated in (B), in response to the results, on the + side, the switches at the MSB and the 2SB of the CDAC 11 are switched to the VRL to shift down the voltage level by 6 and on the − side, the switches at the MSB and the 2SB of the CDAC that samples the VIN− are switched to the VRH to shift up the voltage level by 6.

In FIG. 8, as illustrated in (C), the switches at the 2SB and the 3SB of the CDAC 12 are switched to the VRL and the VRCH is set to 12, and the switches at the 2SB and the 3SB of the CDAC 13 are switched to the VRH and the VRCL is set to 4 again before the second time comparison. The same setting change is made also on the − side. In this state, a comparison is made. On the + side, the voltage level exists between 8 and 12, and therefore, the comparison result of the Dn and the Dn−1 will be 10. On the − side, the voltage level exists between 4 and 8, and therefore, the comparison result of the Dn and the Dn−1 will be 01.

In FIG. 8, as illustrated in (D), in response to the results, on the + side, the switch at the 3SB of the CDAC 11 is switched to the VRL and the switch at the 4SB to the VRH to shift down the voltage level by 2, and on the − side, the switch at the 3SB of the CDAC that samples the VIN− is switched to the VRH and the switch at the 4SB to the VRL to shift up the voltage level by 2.

In FIG. 8, as illustrated in (D), the switches at the 4SB and the 5SB of the CDAC 12 are switched to the VRL and the VRCH is set to 12, and the switches at the 4SB and the 5SB of the CDAC 13 are switched to the VRH and the VRCL is set to 4 again before the third time comparison. The same setting change is made also on the − side. In this state, a comparison is made. On the + side, the voltage level exists between 4 and 8, and therefore, the comparison result of the Dn and the Dn−1 will be 01. On the − side, the voltage level exists between 8 and 12, and therefore, the comparison result of the Dn and the Dn−1 will be 10.

In FIG. 8, as illustrated in (F), in response to the results, on the + side, the switch at the 5SB of the CDAC 11 is switched to the VRH and the switch at the 6SB to the VRL to shift up the voltage level by 2. Similarly, on the − side also, the switch at the 5SB of the CDAC that samples the VIN− is switched to the VRL and the switch at the 6SB to the VRH to shift down the voltage level by 2.

In FIG. 8, as illustrated in (G), the switches at the 6SB and the 7SB of the CDAC 12 are switched to the VRL and the VRCH is set to 12, and the switches at the 6SB and the 7SB of the CDAC 13 are switched to the VRH and the VRCL is set to 4 again before the final comparison. The same setting change is made also on the − side. In this state, a comparison is made. On the + side, the voltage level exists between 3 and 4, and therefore, the comparison result of the Dn and the Dn−1 will be 11. On the − side, the voltage level exists between 0 and 1, and therefore, the comparison result of Dn and Dn−1 will be 00.

Due to this, as the conversion results, "11", "10", "01", and "11" in the binary notation are obtained in the order from the highest and it is known that the VIN+ is 231 in the decimal notation and the VIN− is 24 in the decimal notation.

As above, in the case of the single end input in FIG. 2, three DACs are provided and in the case of the differential input, six DACs are provided. The DAC that utilizes a resistor string has such a problem that power consumption is large and the CDAC has such a problem that the area is increased.

As explained above, the DA conversion circuit using a resistor string has such a problem that power consumption increases because a constant current is caused to flow through the resistor string. The CDAC has small power consumption, however, has such a problem that the area increases if the resolution is increased because the capacitance is increased. Further, there is such a problem that the area of the CDAC increases if the number of bits determined at one step is increased in the SAR type AD conversion circuit that utilizes the CDAC.

The AD conversion circuit of the embodiment explained below has small power consumption and a small circuit area.

Figure 9:
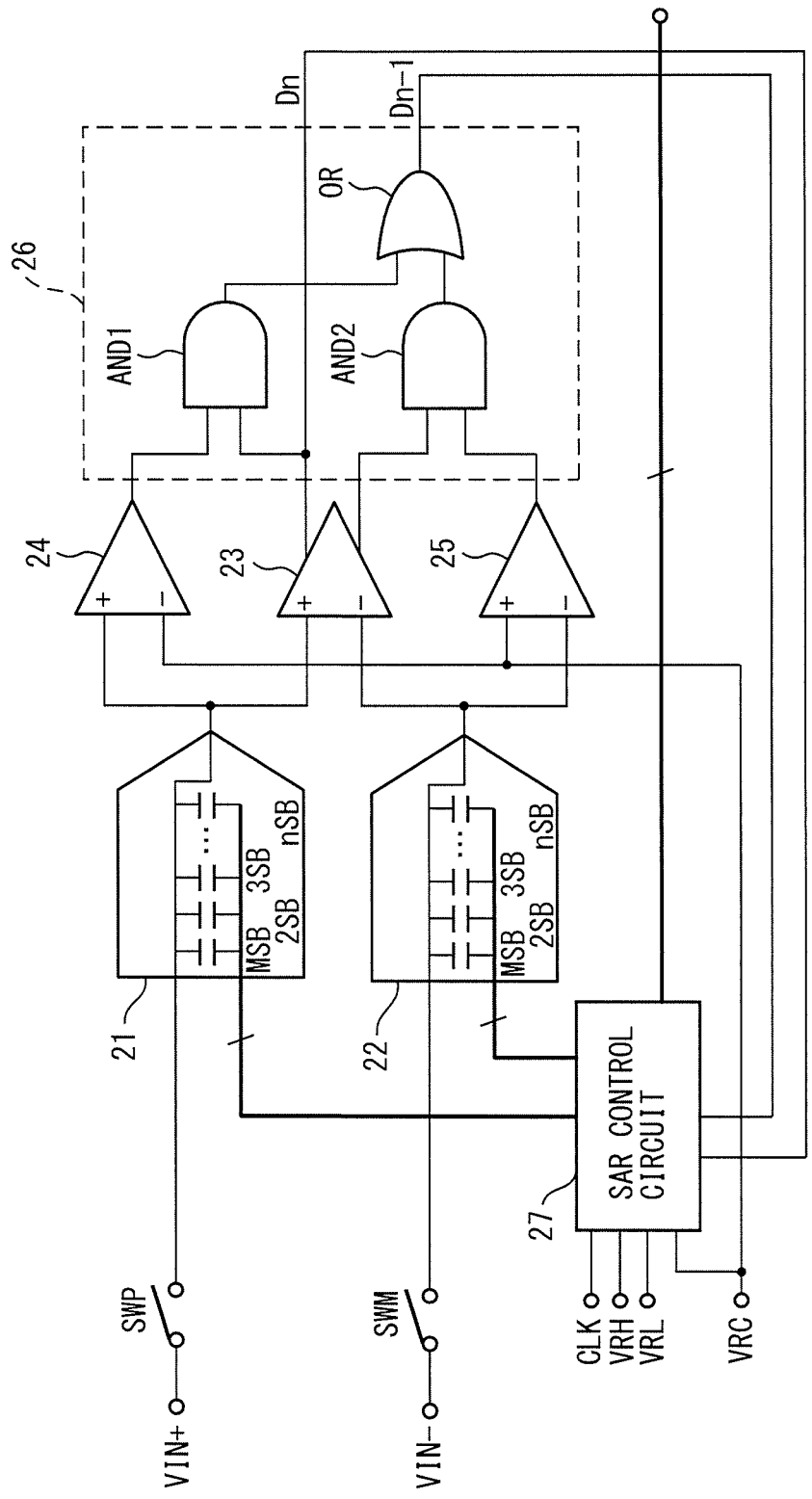
FIG. 9 is a diagram illustrating a configuration of an SAR type AD conversion circuit of a first embodiment.

FIG. 9 is a diagram illustrating a configuration of an SAR type AD conversion circuit of a first embodiment. The SAR type AD conversion circuit of the first embodiment determines two bits at one step, however, the first step is divided into two operations.

As illustrated in FIG. 9, the SAR type AD conversion circuit of the first embodiment has two CDACs 21 and 22, three comparators 23 to 25, an arithmetic operation circuit 26, an SAR control circuit 27, and two switches SWP and SWM. CLK denotes a clock for the SAR control circuit to operate. The VRH and the VRL correspond to the upper limit and the lower limit of the range of voltage of a signal on which the SAR type AD conversion circuit performs AD conversion processing, and the range of voltage of the analog signal VIN+ is amplified so as to correspond to the VRH and the VRL. The common voltage VRC is at an intermediate voltage level between the VRH and the VRL and is supplied from outside, however, it may also be possible to generate the common voltage VRC from the VRH and the VRL by a voltage divider circuit, etc., using a capacitor. Further, it is assumed that the differential analog signals VIN+ and VIN− are signals symmetrical to each other with respect to the common voltage VRC, i.e. have voltage values symmetrical to each other with respect to the common voltage VRC.

Figure 10:
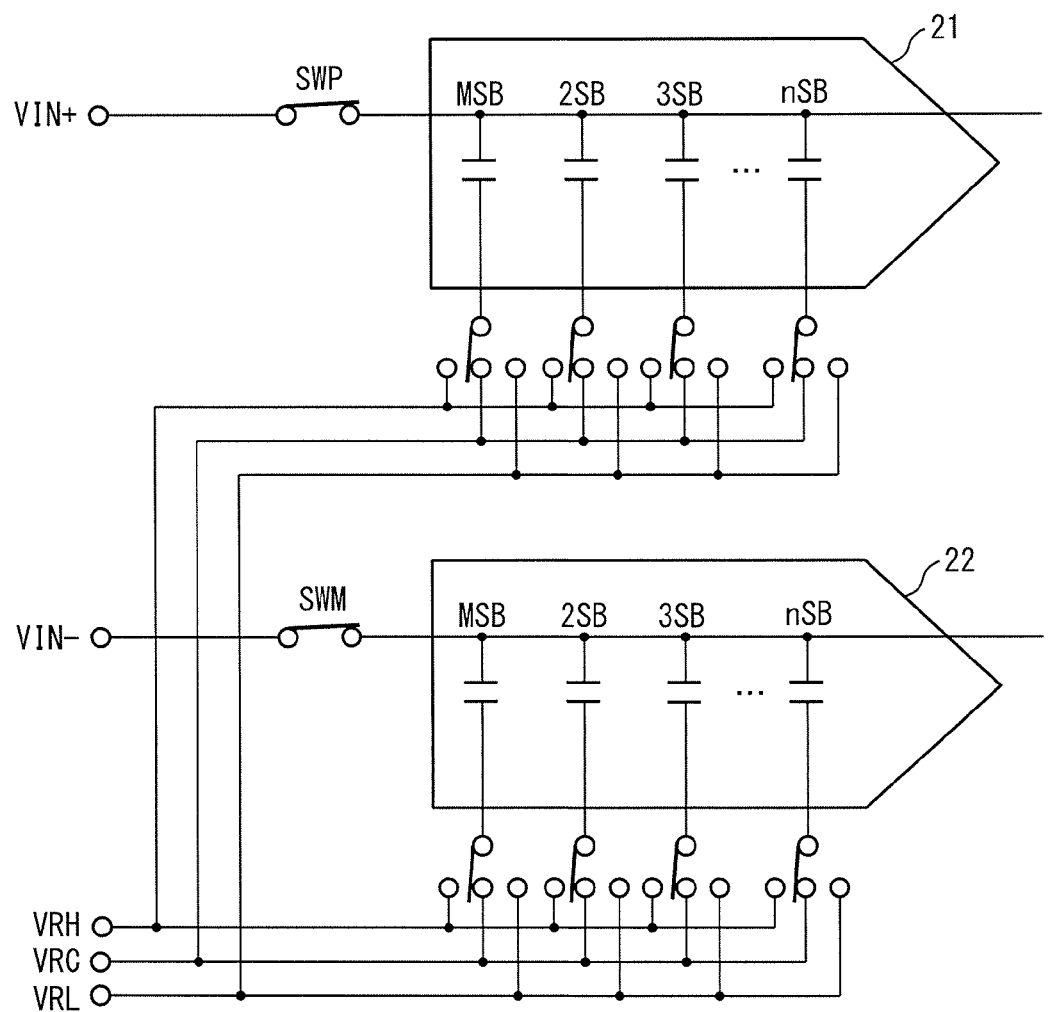
FIG. 10 is a diagram illustrating the portion of the CDACs and the switches in detail.

FIG. 10 is a diagram illustrating the portion of the CDACs 21 and 22 and the switches SWP and SWM in detail.

As is obvious from comparison with FIG. 3, to the signal lines of the two CDAC 21 and CDAC 22, the differential analog signals VIN+ and VIN− are supplied via the switches SWP and SWM. The configuration of the CDAC 21 and the CDAC 22 is the same as that in FIG. 3. It is possible for the CDAC 21 to increase and decrease the output by about (VRH−VRL)/2 by sampling the VIN+ and switching the three-point switches. It is possible for the CDAC 22 to increase and decrease the output by about (VRH−VRL)/2 by sampling the VIN− and switching the three-point switches.

Returning to FIG. 9, the comparator 23 compares the output of the CDAC 21 and the output of the CDAC 22. The comparator 24 compares the output of the CDAC 21 and the VRC. The comparator 25 compares the output of the CDAC 22 and the VRC.

The arithmetic operation circuit 26 has the two AND gates AND1 and AND2 and the OR gate OR. The arithmetic operation circuit 26 has the same configuration and performs the same operation as those of the arithmetic operation circuit 17 in FIG. 2, and therefore, explanation is omitted.

The SAR control circuit 27 controls the three-point switches of the CDAC 21 and the CDAC 22 and the SWP and the SWM in accordance with the data Dn and Dn−1 output from the arithmetic operation circuit 26.

Next, the operation of the SAR type AD conversion circuit of the first embodiment is explained.

As described above, the SAR type AD conversion circuit of the first embodiment has the two CDACs, i.e. the CDAC 21 of the + side input and the CDAC 22 of the − side input. By the one comparator 23, the output of the CDAC 21 and that of the CDAC 22 are compared and at the same time, the two comparators 24 and 25 compare the output of the CDAC 21 and the output of the CDAC 22 with the reference voltage. In the first embodiment, the reference voltage is fixed to the common voltage VRC.

In order to carry out one-time AD conversion, steps of performing sampling and of performing 2-bit comparison and shift in the order of 2-bit comparison, shift, 2-bit comparison, shift, . . . , 2-bit comparison are performed repeatedly, and the number of times of repetition is determined by the number of bits.

In the first embodiment, the operation at the first step is divided into the first half and the second half and 1-bit comparison is made, respectively. At the second and subsequent steps, 2-bit comparison is made at one step. Consequently, in the case where N-bit conversion is carried out, N/2 steps in total are performed and comparison is made (N/2+1) times. After each comparison, the voltages of the CDACs 21 and 22 are shifted.

Sampling is performed by temporarily connecting the SWP and the SWM and then shutting off them again in the state where all the three-point switches of the CDAC 21 and the CDAC 22 are connected to the VRC. Due to this, the VIN+ is sampled and held by the CDAC 21 and the VIN− is sampled and held by the CDAC 22. After the sampling, according to the comparison result, the step of comparison of the output levels of the CDAC 21 and the CDAC 22 and the step of shift are repeated in accordance with a predetermined sequence.

FIG. 11 is a diagram illustrating a sequence to switch connections of the three-point switches of the CDAC 21 and the CDAC 22. In FIG. 11, the first time comparison is made and the operation after the comparison is performed in the first half of the first step and the second time comparison is made and the operation after the comparison is performed in the second half of the first step. In FIG. 11, the sequence described by the + side is the sequence for the CDAC 21 that samples the VIN+ and the sequence described by the − side is the sequence for the CDAC 22 that samples the VIN−. In FIG. 11, the upward arrow indicates switching from the VRC to the VRH and switching from the VRL to the VRC of the corresponding three-point switch of the capacitor array, and the downward arrow indicates switching from the VRC to the VRL and switching from the VRH to the VRC.

Figure 12A:
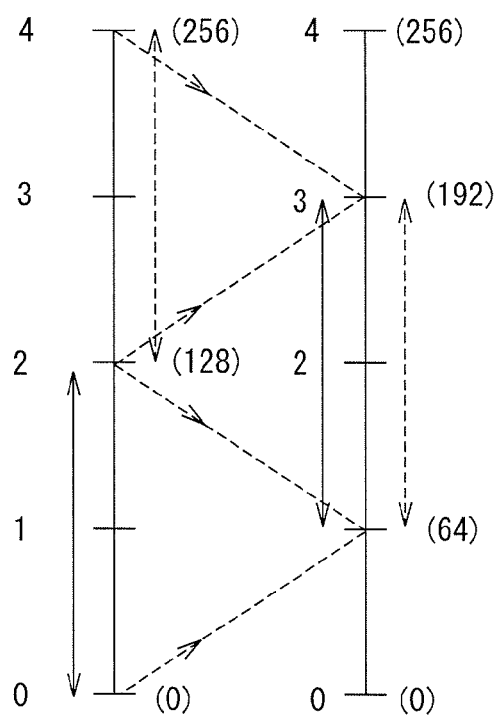
FIG. 12A and FIG. 12B are diagrams each illustrating a shift sequence in which the first time comparing operation is performed with the sequence illustrated in FIG. 11 and then a shift is performed based on the result of the comparison.
Figure 12B:
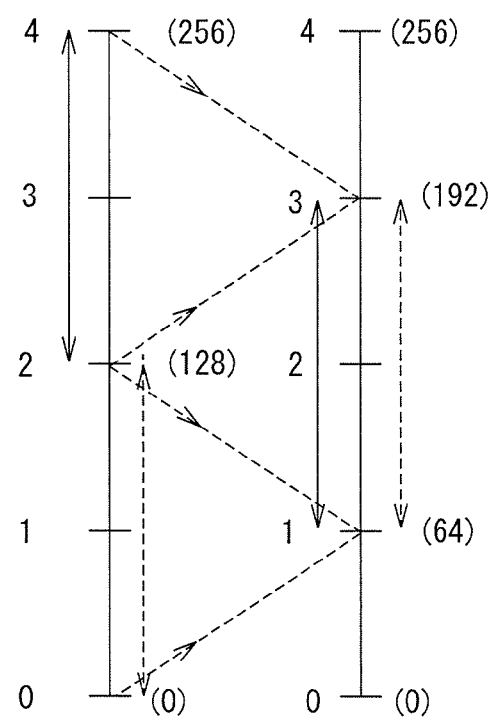

FIG. 12A and FIG. 12B are diagrams each illustrating a shift sequence in which the first time comparing operation is performed with the sequence illustrated in FIG. 11 and then a shift is performed based on the result of the comparison. FIG. 12A and FIG. 12B each illustrate a case where the range of existence of the VIN+ and the VIN− is included in either of two ranges into which the input voltage range is halved. In FIG. 12A and FIG. 12B, the solid-line arrow along the scale on the left side indicates the range of existence of the voltage of the VIN+, the broken-line arrow indicates the range of existence of the voltage of the VIN−, and the portion at which the solid-line arrow and the broken-line arrow overlap along the scale on the right side indicates the shifted range. In FIG. 12A and FIG. 12B, the reason that the range is from 0 to 4 is that one bit is determined by the first time comparing operation, then one bit is determined by the second time comparison, and therefore, the total is two bits, and if the LSB at the time of the second comparison is assumed to be 1, the maximum will be 4.

As illustrated in FIG. 12A, in the case where the result of comparison of the Dn is 0 in the first time comparison, it is known that the output voltage of the CDAC 21 on the + side exists between 0 and 2 and the output voltage of the CDAC 22 on the − side exists between 2 and 4. By the voltage shift after that, the output voltage of the CDAC 21 on the + side is increased by 1 and the output voltage of the CDAC 22 on the − side is reduced by 1.

As illustrated in FIG. 12B, in the case where the result of comparison of the Dn is 1 in the first time comparison, the output voltage of the CDAC 21 on the + side exists between 2 and 4 and the output voltage of the CDAC 22 on the − side exists between 0 and 2. By the voltage shift after that, the output voltage of the CDAC 21 on the + side is reduced by 1 and the output voltage of the CDAC 22 on the − side is increased by 1. By changing the amount of shift in accordance with the comparison result as described above, the output voltages on both the + side and the − side are caused to exist between 1 and 3 without fail after the shift regardless of the comparison result.

FIG. 13A and FIG. 13B are diagrams each illustrating a shift sequence in which the second time comparing operation is performed with the sequence illustrated in FIG. 11 and then a shift is performed based on the result of the comparison. FIG. 13A and FIG. 13B each illustrate a case where the range of existence of the VIN+ and the VIN− is included in either of two ranges into which the voltage range is halved. In FIG. 13A and FIG. 13B, the reason that the range is from 0 to 8 is that one bit is determined by the second time comparison, then two bits are determined at the second step, and therefore, the total is three bits, and if the LSB at the time of comparison at the second step is assumed to be 1, the maximum will be 8.

As illustrated in FIG. 13A, in the case where the result of the second time comparison is 0, the output voltage of the CDAC 21 on the + side exists between 0 and 4 and the output voltage of the CDAC 22 on the − side exists between 4 and 8. By the voltage shift after that, the output voltage of the CDAC 21 on the + side is increased by 1 and the output voltage of the CDAC 22 on the − side is reduced by 3.

As illustrated in FIG. 13B, in the case where the result of comparison of the Dn is 1, the output voltage of the CDAC 21 on the + side exists between 4 and 8 and the output voltage of the CDAC 22 on the − side exists between 0 and 4. By the voltage shift after that, the output voltage of the CDAC 21 on the + side is reduced by 3 and the output voltage of the CDAC 22 on the − side is increased by 1. By changing the amount of shift in accordance with the comparison result as described above, the output voltages on both the + side and the − side are caused to exist between 1 and 5 without fail after the shift regardless of the comparison result.

FIG. 14A to FIG. 14D are diagrams each illustrating a shift sequence in which the third time and subsequent comparing operations at the second and subsequent steps are performed with the sequence illustrated in FIG. 11 and then a shift is performed based on the results of the comparisons. In FIG. 14A to FIG. 14D, the reason that the range is from 0 to 16 is that two bits are determined by the comparison at the second and subsequent steps, then two bits are determined by the next time comparison, and therefore, the total is four bits, and if the LSB at the time of the next time comparison is assumed to be 1, the maximum will be 16.

As illustrated in FIG. 14A, in the case where the result of comparison of the Dn and the Dn−1 is 00, the output voltage of the CDAC 21 on the + side exists between 0 and 4 and the output voltage of the CDAC 22 on the − side exists between 12 and 16. By the voltage shift after that, the output voltage of the CDAC 21 on the + side is increased by 9 and the output voltage of the CDAC 22 on the − side is reduced by 3.

As illustrated in FIG. 14B, in the case where the result of comparison of the Dn and the Dn−1 is 01, the output voltage of the CDAC 21 on the + side exists between 4 and 8 and the output voltage of the CDAC 22 on the − side exists between 8 and 12. By the voltage shift after that, the output voltage of the CDAC 21 on the + side is increased by 5 and the output voltage of the CDAC 22 on the − side is increased by 1.

As illustrated in FIG. 14C, in the case where the result of comparison of the Dn and the Dn−1 is 10, the output voltage of the CDAC 21 on the + side exists between 8 and 12 and the output voltage of the CDAC 22 on the − side exists between 4 and 8. By the voltage shift after that, the output voltage of the CDAC 21 on the + side is increased by 1 and the output voltage of the CDAC 22 on the − side is increased by 5.

As illustrated in FIG. 14D, in the case where the result of comparison of the Dn and the Dn−1 is 11, the output voltage of the CDAC 21 on the + side exists between 12 and 16 and the output voltage of the CDAC 22 on the − side exists between 0 and 4. By the voltage shift after that, the output voltage of the CDAC 21 on the + side is reduced by 3 and the output voltage of the CDAC 22 on the − side is increased by 9. By changing the amount of shift in accordance with the comparison result as described above, the output voltages on both the + side and the − side are caused to exist between 9 and 13 without fail after the shift regardless of the comparison result.

FIG. 15 is a diagram putting together the shift result after the comparison and the transition of the range in the next comparison.

As illustrated in FIG. 15, the first time comparison is made in the range between 0 and 4 and the range is compressed to the range between 1 and 3 by the shift after the comparison. This is the range between 0 and 8 for the second time comparison. The second comparison is made in the range between 0 and 8 and the range is compressed to the range between 1 and 5 by the shift after the comparison. This is the range between 0 and 16 for the third time comparison. The third and subsequent comparisons are made in the range between 0 and 16 and the range is compressed to the range between 9 and 13 by the shift after the comparison. This compressed range between 9 and 13 is the range between 0 and 16 for the next comparison. The final comparison is the 2-bit determination, and therefore, the comparison range is indicated by 4.

For the 2-bit determination, three values are compared. The three values are set to $\frac{1}{4}$, $\frac{2}{4}$ ($=\frac{1}{2}$), and $\frac{3}{4}$ on the assumption that the full range is 1. The comparison of $\frac{2}{4}$ uses the comparison between the + side and the − side by the comparator 23. The comparison of $\frac{1}{4}$ uses the comparison between the VRC and the − side by the comparator 25. The comparison of $\frac{3}{4}$ uses the comparison between the + side and the VRC by the comparator 24.

If attention is focused on the transition of the VRC in FIG. 15, when the first time comparison ends and the voltage is shifted, the VRC is located in the position of 4 within the next comparison range. When the second time comparison ends and the voltage is shifted, the VRC is located in the position of 12 within the next comparison range. The position of 12 is the position corresponding to $\frac{3}{4}$, and therefore, it is known that this is the same as the threshold value of the VRCH of the circuit in FIG. 2.

Further, the VRCL having a threshold value of $\frac{1}{4}$ is reproduced by performing the comparison between the − side and the VRC with the input opposite to the input of the comparison between the + side and the VRC.

In the third and subsequent comparisons at the second and subsequent steps, a shift is performed so that the VRC is located in the position of 12 in the next comparison range and the VRC is included within the comparison range at all times. Because of this, the references VRCH and VRCL are not set again for each comparison, which has been the conventional problem, and therefore, it is possible to reduce the number of DACs.

Figure 16:
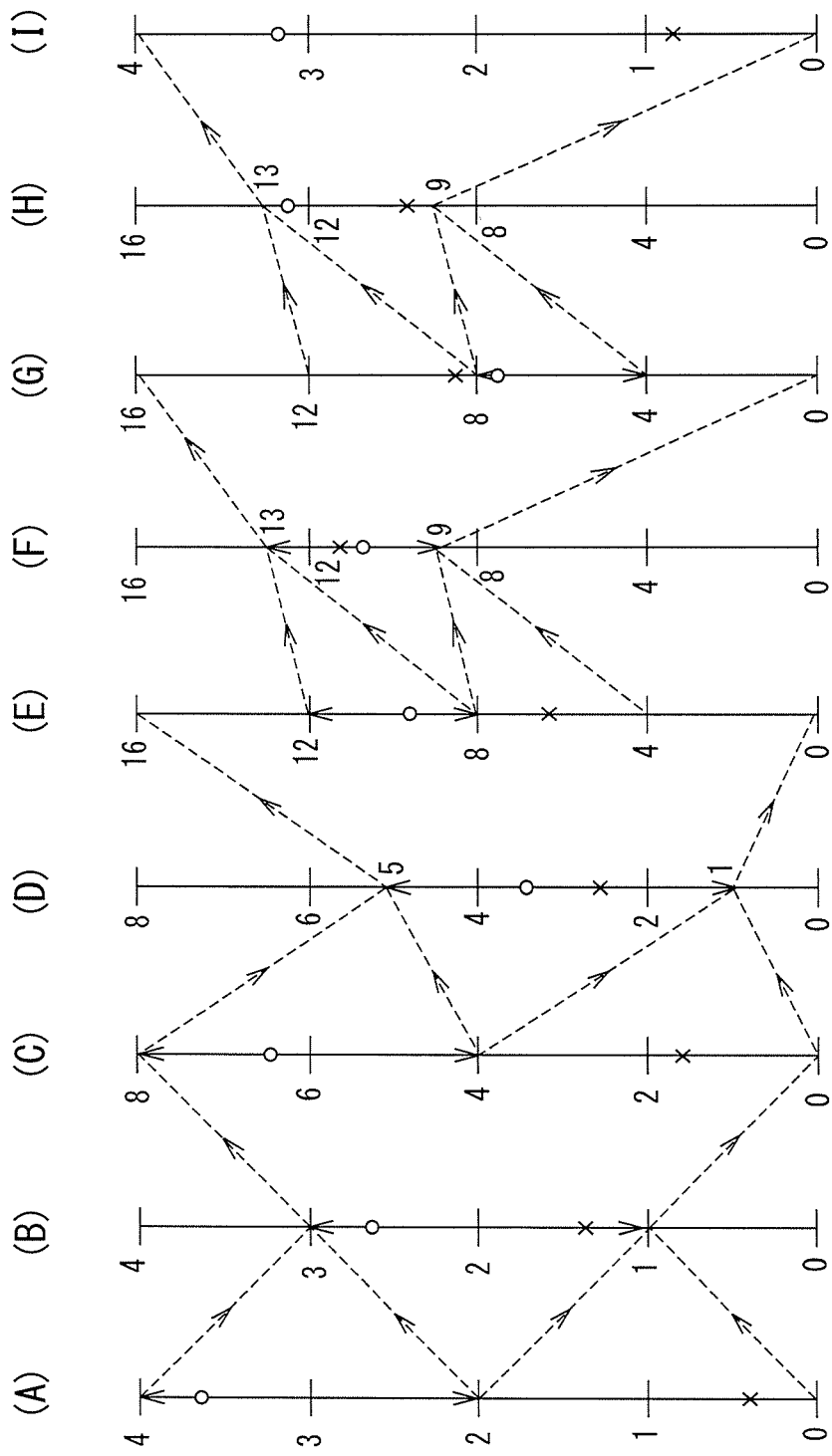
FIG. 16 is a diagram illustrating the transition of the processing in the case where 8-bit AD conversion processing is performed and the voltage level of the sampled differential analog signal is 231 (equal to or more than 231 and less than 232) on the + side and is 24 on the − side in the first embodiment.

FIG. 16 is a diagram illustrating the transition of the processing in the case where 8-bit AD conversion processing is performed and the voltage level of the sampled differential analog signal is 231 (equal to or more than 231 and less than 232) on the + side and is 24 on the − side in the first embodiment. In FIG. 16, the circle symbol indicates the voltage level on the + side and the cross symbol indicates the voltage level on the − side.

Sampling is completed by turning off the SWP and the SWM after temporarily turning on them in the state where the SWP and the SWM are on and all the three-point switches of the CDAC 21 and the CDAC 22 are connected to the VRC at the time of sampling. Due to this, the VIN+ is held by the CDAC 21 and VIN− is held by the CDAC 22. Comparison is started from this state.

In FIG. 16, as illustrated in (A), in the comparison at the first half of the first step, the output voltage of the CDAC 21 on the + side exists between 2 and 4 and the output voltage of the CDAC 22 on the − side exists between 0 and 2, and therefore, the result of comparison of the Dn will be 1.

In response to this result, as illustrated in (B) in FIG. 16, the switch at the MSB of the CDAC 21 on the + side is switched from the VRC to the VRL to shift down the voltage level by 1 and on the − side, the switch at the MSB of the CDAC 22 is switched from the VRC to the VRH to shift up the voltage level by 1.

In FIG. 16, as illustrated in (C), in the comparison at the second half of the first step, the output voltage of the CDAC 21 on the + side exists between 4 and 8 and the output voltage of the CDAC 22 on the − side exists between 0 and 4, and therefore, the result of comparison of the Dn will be 1. In response to this result, as illustrated in (D) in FIG. 16, the switches at the 2SB and the 3SB of the CDAC 21 on the + side are switched from the VRC to the VRL to shift down the voltage level by 3 and the switch at the 3SB of the CDAC 22 on the − side is switched from the VRC to the VRH to shift up the voltage level by 1.

In FIG. 16, as illustrated in (E), in the comparison at the second step, i.e. in the third time comparison, the output voltage of the CDAC 21 on the + side exists between 8 and 12 and the output voltage of the CDAC 22 on the − side exists between 4 and 8, and therefore, the result of comparison of the Dn and the Dn−1 will be 10.

In response to this result, as illustrated in (F) in FIG. 16, the switch at the 5SB of the CDAC 21 on the + side is switched from the VRC to the VRH to shift up the voltage level by 1 and the switch at the 2SB of the CDAC 22 on the − side is switched from the VRC to the VRH and the switches at the 4SB and the 5SB are switched from the VRC to the VRL to shift up the voltage level by 5.

As illustrated in (G) in FIG. 16, in the comparison at the third step, i.e. in the fourth time comparison, the output voltage of the CDAC 21 on the + side exists between 4 and 8 and the output voltage of the CDAC 22 on the − side exists between 8 and 12, and therefore, the result of comparison of the Dn and the Dn−1 will be 01.

In response to this result, as illustrated in (H) in FIG. 16, the switch at the 4SB of the CDAC 21 on the + side is switched from the VRC to the VRH and the switches at the 6SB and the 7SB are switched from the VRC to the VRL to shift up the voltage level by 5 and the switch at the 7SB of the CDAC 22 on the − side is switched from the VRC to the VRH to shift up the voltage level by 1.

As illustrated in (I) in FIG. 16, in the final comparison, the output voltage of the CDAC 21 on the + side exists between 3 and 4 the output voltage of the CDAC 22 on the − side exists between 0 and 1, and therefore, the result of comparison of the Dn and the Dn−1 will be 11.

As above, the result of conversion of the VIN+ is "11", "10", "01", and "11" in the binary notation in order from the highest and it is known that the VIN+ is 231 in the decimal notation. Further, the result of conversion of the VIN− is "00", "01", "01", and "00" in the binary notation, which is opposite to the above result, and it is known that the VIN− is 24 in the decimal notation.

Figure 17:
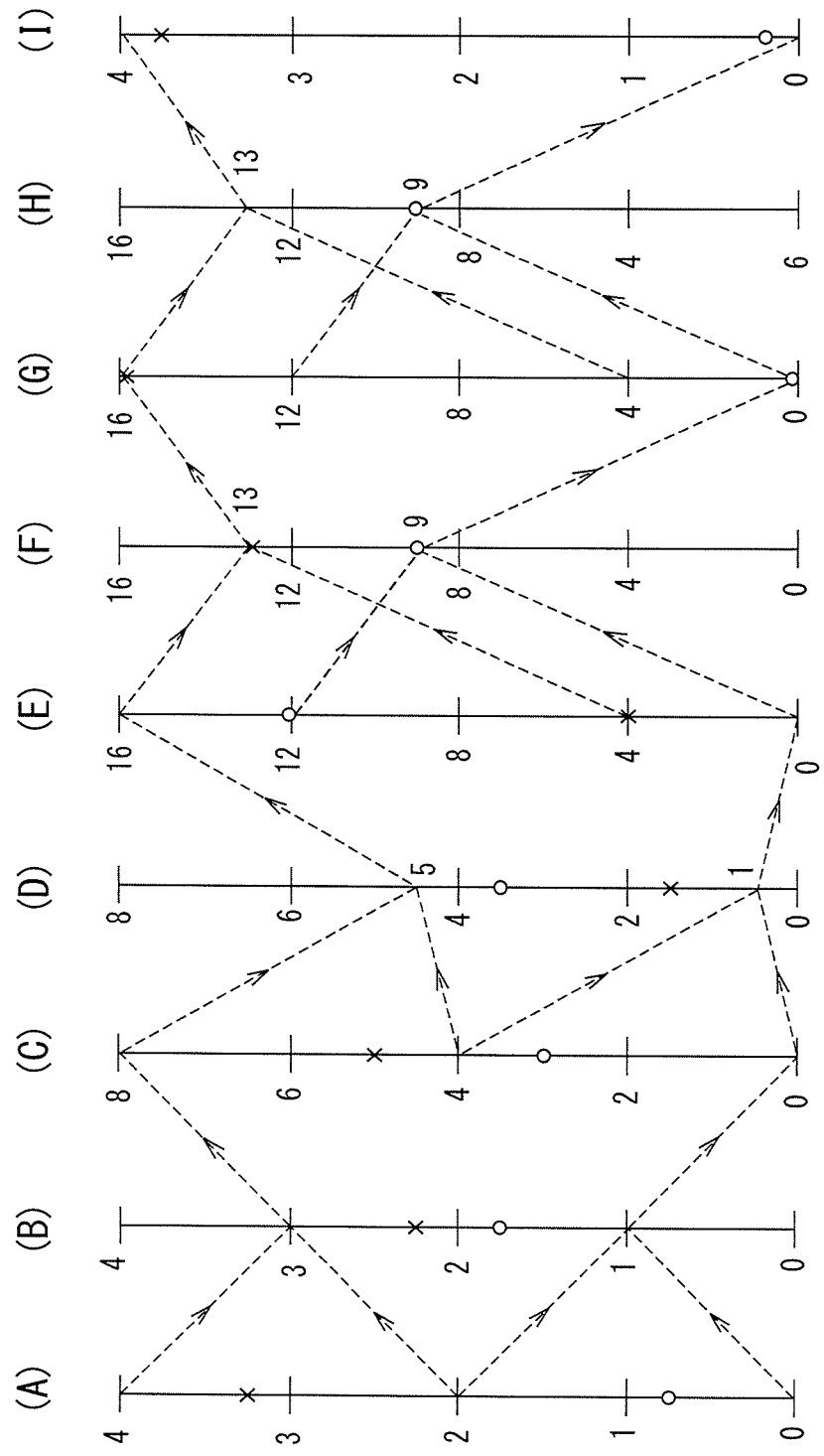
FIG. 17 is a diagram illustrating the transition of the processing in the case where 8-bit AD conversion processing is performed and the voltage level of the sampled differential analog signal is 48 (equal to or more than 48 and less than 49) on the + side and is 207 on the − side in the first embodiment.

FIG. 17 is a diagram illustrating the transition of the processing in the case where 8-bit AD conversion processing is performed and the voltage level of the sampled differential analog signal is 48 (equal to or more than 48 and less than 49) on the + side and is 207 on the − side in the first embodiment. In FIG. 17, the circle symbol indicates the voltage level on the + side and the cross symbol indicates the voltage level on the − side.

Sampling is performed as in the case of FIG. 16.

As illustrated in (A) in FIG. 17, in the first time comparison at the first half of the first step, the output voltage of the CDAC 21 on the + side exists between 0 and 2 and the output voltage of the CDAC 22 on the − side exists between 2 and 4, and therefore, the result of comparison of the Dn will be 0.

In response to this result, as illustrated in (B) in FIG. 17, the switch at the MSB of the CDAC 21 on the + side is switched from the VRC to the VRH to shift up the voltage level by 1 and the switch at the MSB of the CDAC 22 on the − side is switched from the VRC to the VRL to shift down the voltage level by 1.

In the second time comparison at the second half of the first step, as illustrated in (C) in FIG. 17, the output voltage of the CDAC 21 on the + side exists between 0 and 4 and the output voltage of the CDAC 22 on the − side exists between 4 and 8, and therefore, the result of comparison of the Dn will be 0.

In response to this result, as illustrated in (D) in FIG. 17, the switch at the 3SB of the CDAC 21 on the + side is switched from the VRC to the VRH to shift up the voltage level by 1 and the switches at the 2SB and the 3SB of the CDAC 22 on the − side are switched from the VRC to the VRL to shift down the voltage level by 3.

In the comparison at the second step, i.e. in the third time comparison, as illustrated in (E) in FIG. 17, the output voltage of the CDAC 21 on the + side exists between 12 and 16 and the output voltage of the CDAC 22 on the − side exists between 0 and 4, and therefore, the result of comparison of the Dn and the Dn−1 will be 11.

In response to this result, as illustrated in (F) in FIG. 17, the switches at the 4SB and the 5SB of the CDAC 21 on the + side are switched from the VRC to the VRL to shift down the voltage level by 3 and the switch at the 2SB of the CDAC 22 on the − side is switched from the VRL to the VRC and the switch at the 5SB is switched from the VRC to the VRH to shift up the voltage level by 9.

In the comparison at the third step, i.e. in the fourth time comparison, as illustrated in (G) in FIG. 17, the output voltage of the CDAC 21 on the + side exists between 0 and 4 and the output voltage of the CDAC 22 on the − side exists between 12 and 16, and therefore, the result of comparison of the Dn and the Dn−1 will be 00.

In response to this result, as illustrated in (H) in FIG. 17, the switch at the 4SB of the CDAC 21 on the + side is switched from the VRL to the VRC and the switch at the 7SB is switched from the VRC to the VRH to shift up the voltage level by 9 and the switches at the 6SB and the 7SB of the CDAC 22 on the − side are switched from the VRC to the VRL to shift down the voltage level by 3.

In the final comparison, as illustrated in (I) in FIG. 17, the output voltage of the CDAC 21 on the + side exists between 0 and 1 and the output voltage of the CDAC 22 on the − side exists between 3 and 4, and therefore, the result of comparison of the Dn and the Dn−1 will be 00.

As above, the result of conversion is "00", "11", "00", and "00" in the binary notation in order from the highest and it is known that the VIN+ of the differential analog signal is 48 in the decimal notation and the VIN− is 207.

As explained above, in the first embodiment, in the first two comparisons at the first step, 1-bit comparison is made and at the second and subsequent steps, 2-bit comparison is made, and thus, it is possible to fix the reference voltage at the time of comparison to the common voltage VRC. Further, in the first embodiment, only the two CDACs are used, and therefore, it is possible to reduce the area and 2-bit comparison at the second and subsequent steps is made. Furthermore, there is no block through which a constant current is caused to flow, and therefore, it is possible to reduce power consumption.

In the first embodiment explained above, the first step has the first half and the second half and in the first half, 1-bit comparison is made and the shift based on the comparison result is performed and also in the second half, 1-bit comparison is made and the shift based on the comparison result is performed and thus in total 2-bit comparison is made and the shift is performed in the first half and the second half together. In a second embodiment explained next, at the first step also, 2-bit comparison is made and a shift is performed.

Figure 18:
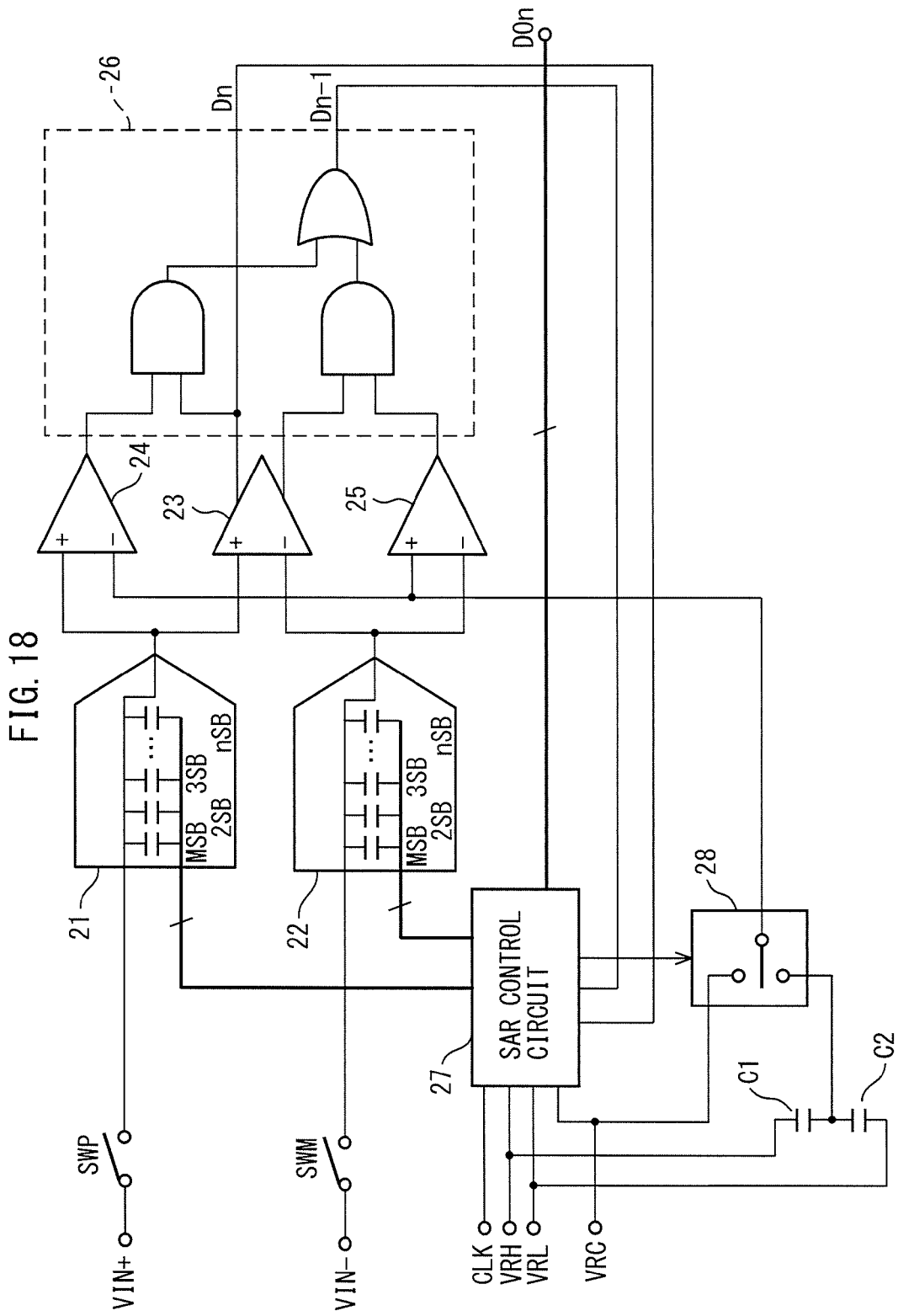
FIG. 18 is a diagram illustrating an entire configuration of an SAR type AD conversion circuit of the second embodiment.

FIG. 18 is a diagram illustrating an entire configuration of an SAR type AD conversion circuit of the second embodiment.

The SAR type AD conversion circuit of the second embodiment differs from that of the first embodiment in that capacitors C1 and C2 connected in series between the VRH and VRL terminals and a switch 28 are provided so as to generate VRCM=(3VRH+VRL)/4 from the VRH and the VRL. The ratio of capacitance value between the capacitors C1 and C2 is 3:1 and the capacitance values are not large, and therefore, the circuit is implemented with a small area. The switch 28 switches a reference voltage to be supplied to the comparators 24 and 25 between the VRC and the VRCM in accordance with the control of the SAR control circuit 27. The SAR control circuit 27 performs control so that the switch 28 selects the VRCM when the first step is performed and selects the VRC at the second and subsequent steps.

In the second embodiment, at the first step, the comparator 23 compares the output voltage of the CDAC 21 and the output voltage of the CDAC 22, i.e. the VIN+ and the VIN−. The comparator 24 compares the output voltage of the CDAC 21 and the VRCM and the comparator 25 compares the output voltage of the CDAC 22 and the VRCM. Due to this, in which of ranges into which the voltage range is quartered, the VIN+ and the VIN− are included is determined. In other words, in which of the ranges between 0 and 4, between 4 and 8, between 8 and 12, and between 12 and 16 of the range between 0 and 16, the VIN+ and the VIN− are included is determined. Based on the comparison result, a shift is performed so that the output voltages of the CDAC 21 and the CDAC 22 are included in the range between 9 and 13. Further, by switching the switch 28 so as to select the VRC, it is possible to perform the same processing as that at the second and subsequent steps in the first embodiment.

In the second embodiment, a circuit configured to generate the reference voltage at the first step and a switching switch are provided and 2-bit comparison is made using two CDACs.

In the second embodiment also, the same effect as that of the first embodiment is obtained.

As explained above, according to the disclosed SAR analog-to-digital conversion circuit, even if the speed is increased by determining two bits at one step, the number of CDACs can be reduced, and therefore, the area can be reduced. Further, at least at the second and subsequent steps, the intermediate level, which is the reference voltage of the second and third comparators is not changed, and therefore, it is possible to reduce an error of the comparator accompanying the change in the reference voltage.

According to the embodiments, only by attaching a capacitor whose capacitance is about twice to three times that of a gate parasitic capacitor of each transistor for switching, the DC-DC converter in which transistors are stacked vertically (multistage cascode connection) is implemented without complicated restrictions on the design.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A successive approximation routine (SAR) analog-to-digital conversion method comprising:
    setting a level between a maximum level and a minimum level of a voltage value of a differential analog signal to be an intermediate level and setting a range between the maximum level and the minimum level to be a conversion range at a first step when sequentially converting the differential analog signal into digital data of two bits at each of steps;
    sampling and holding a positive phase signal of the differential analog signal in a first capacitive digital-to-analog converter (CDAC) and a negative phase signal of the differential analog signal in a second CDAC; and
    at each step of sequentially converting the differential analog signal into digital data of two bits,
    determining in which of four ranges output levels of the sampled and held signals of the first and second CDACs are included, the four ranges corresponding to the conversion range being quartered based on results of comparison of the output levels of the first and second CDACs with the intermediate level,
    determining two bits of the digital data based on the determining result and adjusting the output levels of the first and second CDACs so that a level at ¼ or ¾ of a voltage range, which is one of the four ranges in which the output levels of the first and second CDACs are determined to be included, agrees with the intermediate level, and
    setting the voltage range as a conversion range for a next step.

2. The SAR analog-to-digital conversion method according to claim 1, wherein second and subsequent steps include:

performing a first comparison between the output level of the first CDAC and the output level of the second CDAC, a second comparison between the output level of the first CDAC and the intermediate level, and a third comparison between the output level of the second CDAC and the intermediate level; and determining which range of four ranges the voltage range is included in based on results of the first to third comparisons, the four ranges corresponding to the conversion range being quartered.

3. The SAR analog-to-digital conversion method according to claim 2, wherein:

at the first step, the method performs a former half step and a latter half step, the former half step includes:

performing a comparison between the output level of the first CDAC and the output level of the second CDAC;

determining in which of two ranges the output level of the first CDAC and the output level of the second CDAC are included based on the comparison result, the two ranges corresponding to the conversion range being halved;

determining a first bit of high order based on the determining result and adjusting the output levels of the first and second CDACs so that a level at ½ of a first voltage range, which is one of the two ranges in which the output levels of the first and second CDACs are determined to be included, agrees with the intermediate level; and setting the first voltage range to be a conversion range in a second half step; and the second half step includes:

performing a comparison between the output level of the first CDAC and the output level of the second CDAC;

determining in which of two ranges the output level of the first CDAC and the output level of the second CDAC are included based on the comparison result, the two ranges corresponding to the conversion range being halved;

determining a second bit of high order based on the determination result and, adjusting the output levels of the first and second CDACs so that a level at ½ of a second voltage range, which is one of the two ranges in which the output levels of the first and second CDACs are determined to be included, agrees with the intermediate level; and setting the second voltage range to be a conversion range at a next step.

4. The SAR analog-to-digital conversion method according to claim 2, wherein the first step includes:

performing a comparison between the output level of the first CDAC and the output of the second CDAC, a comparison between the output level of the first CDAC and an initial stage reference level, which is a level at ¼ or ¾ of the range between the maximum level and the minimum level, and a comparison between the output level of the second CDAC and the initial stage reference level; and determining which range of four ranges the voltage range is included in, based on the results of the three comparisons, the four ranges corresponding to the conversion range being quartered.

5. A successive approximation routine (SAR) analog-to-digital conversion circuit comprising:

a first capacitive digital-to-analog converter (CDAC) that samples and holds a positive phase signal of a differential analog signal and which has a first switch for changing output levels;

a second CDAC that samples and holds a negative phase signal of the differential analog signal and which has a second switch for changing output levels;

a first comparator that determines which is larger of the output level of the first CDAC and the output level of the second CDAC;

a second comparator that determines which is larger of the output level of the first CDAC and a reference level;

a third comparator that determines which is larger of the output level of the second CDAC and the reference level;

an arithmetic operation circuit that performs an arithmetic operation to determine outputs of the first to third comparators; and an SAR control circuit that controls the first and second switches of the first and second CDACs based on arithmetic operation results of the arithmetic operation circuit, wherein the SAR control circuit:

sets a range between a maximum level and a minimum level of a voltage value of the differential analog signal to be a conversion range at a first step when sequentially converting the differential analog signal into digital data of two bits at each of steps; and at each step of sequentially converting the differential analog signal into digital data of two bits, determines in which of four ranges output levels of sampled and held signals of the first and second CDACs are included, the four ranges corresponding to the conversion range being quartered, determines two bits of the digital data based on the determination result adjusts the output levels of the first and second CDACs so that a level at ¼ or ¾ of a voltage range, which is one of the four ranges in which the output levels of the first and second CDACs are determined to be included, agrees with the reference level, and controls the first and second switches so that the voltage range is set as a conversion range at a next step.

6. The SAR analog-to-digital conversion circuit according to claim 5, wherein the reference level is an intermediate level between the maximum level and the minimum level, and the SAR control circuit determines, at second and subsequent steps, which range of four ranges the voltage range is included in, based on the results of the comparisons of the first to third comparators, the four ranges corresponding to the conversion range being quartered.

7. The SAR analog-to-digital conversion circuit according to claim 6, wherein the SAR control circuit controls the first and second CDACs so that a first half step and a second half step are performed at the first step:

the first half step includes:

determining in which of two ranges the output level of the first CDAC and the output level of the second CDAC are included based on the comparison result of the first comparator, the two ranges corresponding to the conversion range being halved;

determining a first bit of high order based on the determination result and adjusting the output levels of the first and second CDACs so that a level at ½ of a first voltage range, in which the output levels of the first and second CDACs are determined to be included, agrees with the intermediate level; and setting the first voltage range to be a conversion range in a second half step; and the second half step includes:

determining in which of two ranges the output level of the first CDAC and the output level of the second CDAC are included based on the comparison result of the second comparator, the two ranges corresponding to the conversion range being halved;

determining a second bit of high order based on the determination result and adjusting the output levels of the first and second CDACs so that a level at ¼ or ¾ of a second voltage range, in which the output levels of the first and second CDACs are determined to be included, agrees with the intermediate level; and setting the second voltage range to be a conversion range for a next step.

8. The SAR analog-to-digital conversion circuit according to claim 5, further comprising a switch for switching the reference level between an intermediate level between the maximum level and the minimum level, and the level at ¼ or ¾ of a range between the maximum level and the minimum level, wherein the SAR control circuit:

at a first step, switches the switch to the level at ¼ or ¾ of the range and determines which of the ranges into which the conversion range is quartered, the voltage range is based on the comparison results of the first to third comparators; and at second and subsequent steps, switches the switch to the intermediate level and determines which range of the four ranges the voltage range is included based on the comparison results of the first to third comparators.

* * * * *